(12) United States Patent
Pezzuto et al.

(10) Patent No.: US 7,318,912 B2
(45) Date of Patent: Jan. 15, 2008

(54) MICROFLUIDIC SYSTEMS AND METHODS FOR COMBINING DISCRETE FLUID VOLUMES

(75) Inventors: Marci Pezzuto, Altadena, CA (US); Eugene Dantsker, Sierra Madre, CA (US)

(73) Assignee: Nanostream, Inc., Pasadena, CA (US)

( * ) Notice: Subject to any disclaimer, the term of this patent is extended or adjusted under 35 U.S.C. 154(b) by 974 days.

(21) Appl. No.: 10/150,427

(22) Filed: May 16, 2002

(65) Prior Publication Data

US 2002/0187560 A1    Dec. 12, 2002

Related U.S. Application Data

(60) Provisional application No. 60/296,882, filed on Jun. 7, 2001.

(51) Int. Cl.
*B01L 11/00* (2006.01)
*B01L 3/02* (2006.01)
*B32B 5/02* (2006.01)
*B32B 27/04* (2006.01)
*B32B 27/12* (2006.01)

(52) U.S. Cl. .............. 422/103; 422/50; 422/68.1; 422/81; 422/82; 422/100; 422/101; 422/102; 422/104; 436/43; 436/52; 436/53; 436/180; 137/1; 137/87.01; 137/89; 137/110

(58) Field of Classification Search ............ 422/50, 422/68.1, 81, 82, 100, 101, 102, 103, 104; 436/43, 52, 53, 180; 137/1, 87.01, 89, 110
See application file for complete search history.

(56) References Cited

U.S. PATENT DOCUMENTS

| | | | |
|---|---|---|---|
| 3,799,742 A | 3/1974 | Coleman | 23/253 R |
| 4,426,451 A | 1/1984 | Columbus | 436/518 |
| 4,697,989 A * | 10/1987 | Perlov et al. | 417/53 |
| 5,029,805 A | 7/1991 | Albarda et al. | 251/11 |
| 5,077,017 A | 12/1991 | Gorin et al. | 422/100 |
| 5,222,808 A | 6/1993 | Sugarman et al. | 366/274 |

(Continued)

FOREIGN PATENT DOCUMENTS

| | | |
|---|---|---|
| WO | WO 96/15576 | 5/1996 |
| WO | WO 98/28640 | 7/1998 |
| WO | WO 99/09042 | 2/1999 |
| WO | WO 99/19717 | 4/1999 |
| WO | WO 00/21659 | 4/2000 |

(Continued)

OTHER PUBLICATIONS

Ehrfeld, W., et al., *Potentials and Realization of Microreactors,* "DECHEMA Monographs," vol. 132, VCH Verlagsgesellschaft, 1996, pp. 1-28.

(Continued)

*Primary Examiner*—Brian Sines
(74) *Attorney, Agent, or Firm*—Vincent K. Gustafson; Intellectual Property Technology Law

(57) ABSTRACT

Microfluidic devices capable of combining discrete fluid volumes generally include channels for supplying different fluids toward a sample chamber and means for establishing fluid communication between the fluids within the chamber. Discrete fluid plugs are defined from larger fluid volumes before being combined. Certain embodiments utilize adjacent chambers or subchambers divided by a rupture region such as a frangible seal. Further embodiments utilize one or more deformable membranes and/or porous regions to direct fluid flow. Certain devices may be pneumatically or magnetically actuated.

15 Claims, 12 Drawing Sheets

U.S. PATENT DOCUMENTS

| | | | | |
|---|---|---|---|---|
| 5,250,263 | A | 10/1993 | Manz | 422/81 |
| 5,603,351 | A | 2/1997 | Cherukuri et al. | 137/597 |
| 5,755,942 | A | 5/1998 | Zanzucchi et al. | 204/454 |
| 5,836,750 | A * | 11/1998 | Cabuz | 417/322 |
| 5,846,396 | A | 12/1998 | Zanzucchi et al. | 204/601 |
| 5,863,502 | A | 1/1999 | Southgate et al. | 422/58 |
| 5,932,799 | A | 8/1999 | Moles | 73/53.01 |
| 5,958,344 | A | 9/1999 | Levine et al. | 422/103 |
| 5,960,812 | A | 10/1999 | Johnson | 137/68.14 |
| 5,976,336 | A | 11/1999 | Dubrow et al. | 204/453 |
| 6,043,080 | A | 3/2000 | Lipshutz et al. | 435/287.2 |
| 6,068,751 | A | 5/2000 | Neukermans | 204/601 |
| 6,073,482 | A * | 6/2000 | Moles | 73/53.01 |
| 6,074,725 | A | 6/2000 | Kennedy | 428/188 |
| 6,117,396 | A | 9/2000 | Demers | 422/100 |
| 6,136,212 | A | 10/2000 | Mastrangelo et al. | 216/49 |
| 6,193,471 | B1 | 2/2001 | Paul | 417/53 |
| 6,331,439 | B1 | 12/2001 | Cherukuri et al. | 436/174 |
| 6,408,878 | B2 | 6/2002 | Unger et al. | 137/597 |
| 6,415,821 | B2 | 7/2002 | Kamholz et al. | 137/827 |
| 6,418,968 | B1 * | 7/2002 | Pezzuto et al. | 137/833 |
| 6,488,896 | B2 * | 12/2002 | Weigl et al. | 422/101 |
| 6,494,614 | B1 | 12/2002 | Bennett et al. | 366/336 |
| 6,533,840 | B2 | 3/2003 | Martin et al. | 95/45 |
| 6,537,501 | B1 | 3/2003 | Holl et al. | 422/101 |
| 6,537,506 | B1 | 3/2003 | Schwalbe et al. | 422/130 |
| 6,601,613 | B2 | 8/2003 | McNeely et al. | 137/833 |
| 6,619,311 | B2 * | 9/2003 | O'Connor et al. | 137/109 |
| 6,793,753 | B2 * | 9/2004 | Unger et al. | 156/155 |
| 6,802,342 | B2 * | 10/2004 | Fernandes et al. | 137/832 |
| 2002/0054702 | A1 | 5/2002 | Wihl et al. | 382/145 |
| 2002/0068357 | A1 | 6/2002 | Mathies et al. | 435/287.2 |

FOREIGN PATENT DOCUMENTS

| | | |
|---|---|---|
| WO | WO 01/88204 A1 | 11/2001 |
| WO | WO 02/01184 A1 | 1/2002 |
| WO | WO 02/29106 A2 | 4/2002 |
| WO | WO 03/015922 A1 | 2/2003 |

OTHER PUBLICATIONS

Kikutani, Y., et al., "Fabrication of a Glass Microchip with a Three-Dimensional Channel Network and its Application to a Single-Chip Combinatorial Synthetic Reactor," *Micro Total Analysis Systems,* J.M. Ramsey and A. van den Berg (eds.), 2001 Kluwer Academic Publishers, the Netherlands, pp. 161-162.

Gravesen, Peter, et al., *Microfluidics—a review,* "J. Micromech. Microeng.," 3, (1993), United Kingdom, pp. 168-182.

* cited by examiner

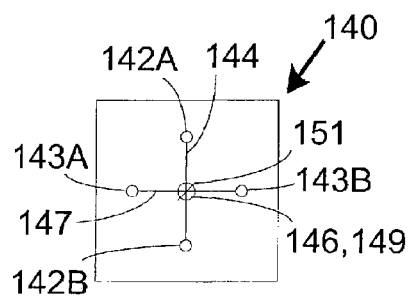
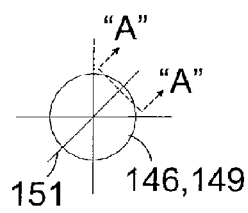
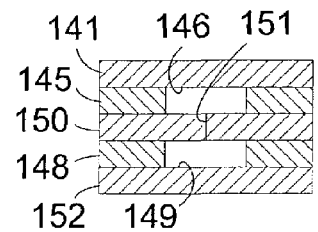
FIG. 1A     FIG. 1B     FIG. 1C
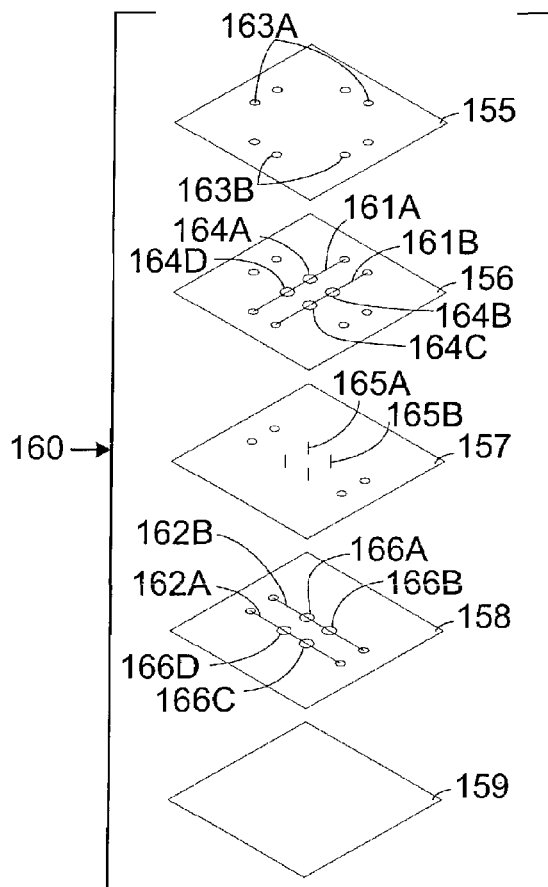
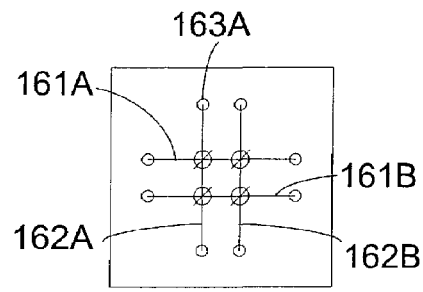
FIG. 2B
FIG. 2A

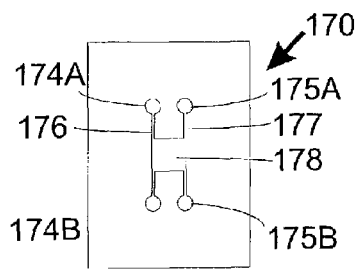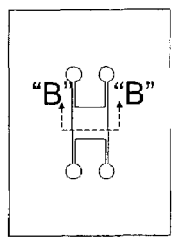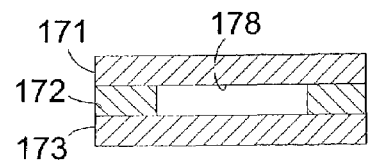
FIG. 3A   FIG. 3B   FIG. 3C
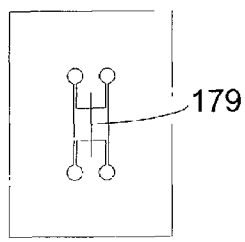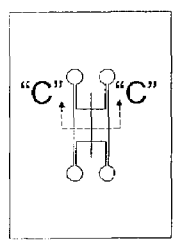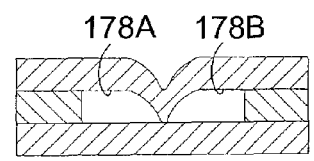
FIG. 3D   FIG. 3E   FIG. 3F
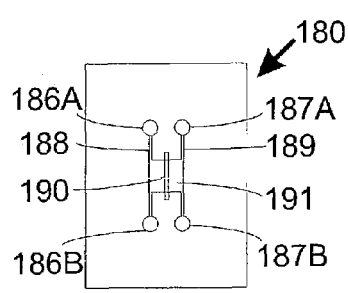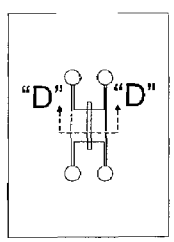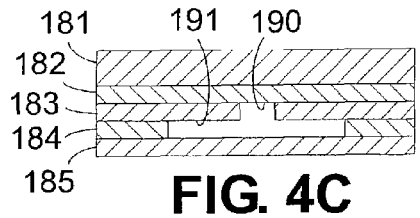
FIG. 4A   FIG. 4B
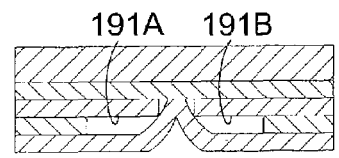
FIG. 4D

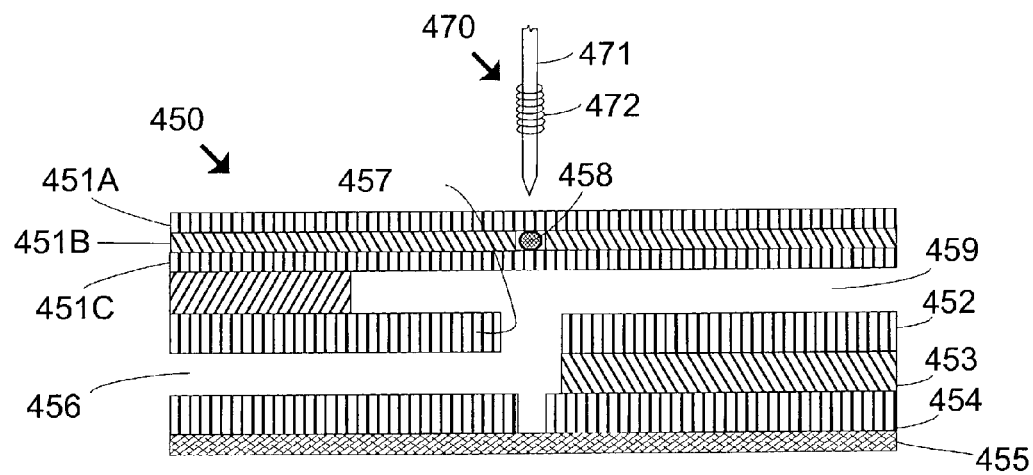
FIG._13A
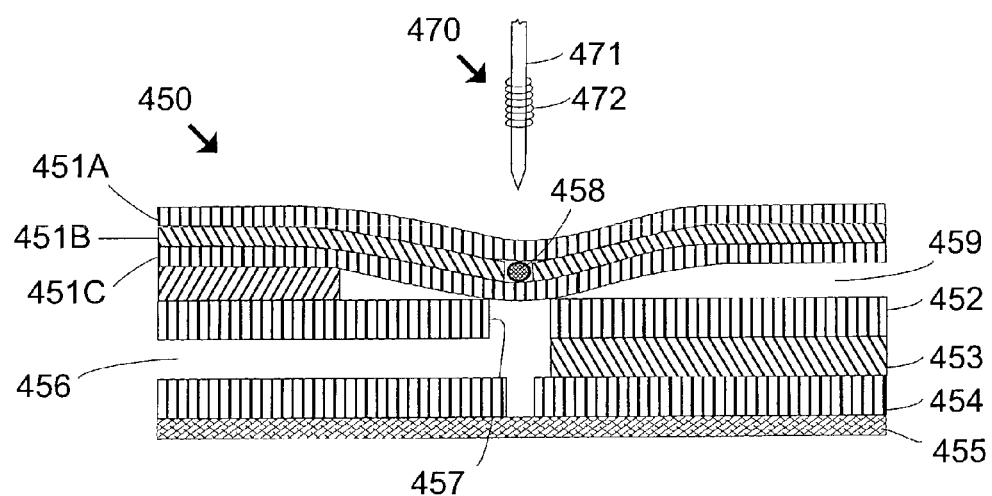
FIG._13B

MICROFLUIDIC SYSTEMS AND METHODS FOR COMBINING DISCRETE FLUID VOLUMES

STATEMENT OF RELATED APPLICATION(S)

This application claims benefit of U.S. Provisional Patent Application Ser. No. 60/296,882, filed Jun. 7, 2001 and now abandoned.

FIELD OF THE INVENTION

The present invention relates to systems and methods for combining discrete fluid volumes in microfluidic devices, such as may be useful for performing chemical and biological synthesis.

BACKGROUND OF THE INVENTION

There has been a growing interest in the manufacture and use of microfluidic systems for the acquisition of chemical and biological information. In particular, when conducted in microfluidic volumes, complicated biochemical reactions may be carried out using very small volumes of liquid. Among other benefits, microfluidic systems increase the response time of reactions, minimize sample volume, and lower reagent consumption. When volatile or hazardous materials are used or generated, performing reactions in microfluidic volumes also enhances safety and reduces disposal quantities.

Traditionally, microfluidic devices have been constructed in a planar fashion using techniques that are borrowed from the silicon fabrication industry. Representative systems are described, for example, in some early work by Manz et al. (Trends in Anal. Chem. (1990) 10(5): 144-149; Advances in Chromatography (1993) 33: 1-66). In these publications, microfluidic devices are constructed by using photolithography to define channels on silicon or glass substrates and etching techniques to remove material from the substrate to form the channels. A cover plate is bonded to the top of the device to provide closure. Miniature pumps and valves can also be constructed to be integral (e.g., within) such devices. Alternatively, separate or off-line pumping mechanisms are contemplated.

More recently, a number of methods have been developed that allow microfluidic devices to be constructed from plastic, silicone or other polymeric materials. In one such method, a negative mold is first constructed, and plastic or silicone is then poured into or over the mold. The mold can be constructed using a silicon wafer (see, e.g., Duffy et al., Analytical Chemistry (1998) 70: 4974-4984; McCormick et. al., Analytical Chemistry (1997) 69: 2626-2630), or by building a traditional injection molding cavity for plastic devices. Some molding facilities have developed techniques to construct extremely small molds. Components constructed using a LIGA technique have been developed at the Karolsruhe Nuclear Research center in Germany (see, e.g., Schomburg et al., Journal of Micromechanical Microengineering (1994) 4: 186-191), and commercialized by Micro-Parts (Dortmund, Germany). Jenoptik (Jena, Germany) also uses LIGA and a hot-embossing technique. Imprinting methods in PMMA have also been demonstrated (see, Martynova et al., Analytical Chemistry (1997) 69: 4783-4789). However, these techniques do not lend themselves to rapid prototyping and manufacturing flexibility. Additionally, the foregoing references teach only the preparation of planar microfluidic structures. Moreover, the tool-up costs for both of these techniques are quite high and can be cost-prohibitive.

When working with fluids in conventional macrofluidic volumes, tasks such as metering discrete fluid volumes and then combining those volumes is relatively straightforward. In microfluidic volumes, however, such tasks are considerably more difficult. Most, if not all, microfluidic systems require some interface to the conventional macrofluidic world. Using conventional techniques, the smallest volume of fluid that can be generated is a droplet, typically ranging in volume between approximately 1-100 microliters. At the low end of this volumetric range it is extremely difficult to consistently create droplets having a reasonably low volumetric standard deviation. Applications in which fluidic metering accuracy is important include combinatorial chemistry and microfluidic synthesis. In both applications, it would be desirable to combine repeatably accurate discrete fluid volumes. For example, it would be desirable to provide stoichiometric microfluidic volumes of reagents and solvents when performing synthesis, and it would be desirable to provide accurate amounts of sample and diluent when performing serial dilution.

A known method for combining fluids is to dispense fluid droplets from pipet tips into a microtiter plate. However, the utility of such a method is limited for several reasons. To begin with, because a conventional microtiter plate is open to atmosphere, evaporation of fluid following dispensation is an inherent problem, and such dispensing must take place in an ultra-clean environment to avoid undesirable contamination. Further, surfactants are often used in conjunction with pipet tips to increase the accuracy of dispensing small volumes. These surfactants can detrimentally compromise the purity of the fluids to be metered, and it may be very challenging to remove the surfactants and purify the fluids of interest for further use. Additionally, after the fluids of interest are combined in a well plate, if further processing is desired, it can be cumbersome to extract and transfer the fluids elsewhere.

Accordingly, there exists a need for improved systems and methods for combining discrete microscale fluid volumes.

SUMMARY OF THE INVENTION

In a first separate aspect of the invention, a multi-layer microfluidic device includes a first microfluidic chamber defined in a first device layer and a second microfluidic chamber defined in a second device layer. Microfluidic channels supply a first fluid and a second fluid to the microfluidic chambers. A third device layer disposed between the first device layer and the second device layer defines a rupture region separating the first microfluidic chamber from the second microfluidic chamber.

In another separate aspect of the invention, a multi-layer microfluidic device includes a first group microfluidic chambers defined in a first device layer and a second group of microfluidic chambers defined in a second device layer. At least one first and at least one second microfluidic channels supply fluid to the microfluidic chambers. A third device layer disposed between the first device layer and the second device layer defines a rupture region separating at least one chamber of the first group of microfluidic chambers from at least one chamber of the second group of microfluidic chambers.

In another separate aspect of the invention, a multi-layer microfluidic device includes a microfluidic chamber bounded along one surface by a first device layer and bounded along another surface by a deformable membrane. The deformable membrane is adapted to selectively engage the first surface to selectively partition the microfluidic chamber into a first subchamber and a second subchamber. A first fluid inlet is capable of supplying a first fluid to the first subchamber, and a second fluid inlet is capable of supplying a second fluid to the second subchamber.

In yet another separate aspect of the invention, a multi-layer microfluidic device for combining discrete volumes of at least two fluids includes a microfluidic chamber bounded along a surface by a deformable membrane. A first microfluidic channel is adapted to supply a first fluid to the microfluidic chamber, and a second microfluidic channel is adapted to supply a second fluid to the microfluidic chamber. The deformable membrane is adapted to selectively block the passage of the first fluid into the microfluidic chamber and selectively block the passage of the second fluid into the microfluidic chamber.

In another separate aspect of the invention, a multi-layer microfluidic device for combining discrete volumes of at least two fluids includes a first microfluidic chamber and a second chamber. A first microfluidic channel is adapted to supply a first fluid to the microfluidic chamber, and a second microfluidic channel is adapted to supply a second fluid to the microfluidic chamber. A first porous region having a first liquid permeability is disposed between the first microfluidic channel and the first chamber, and also between the second microfluidic channel and the first chamber. A second porous region having a second liquid permeability is disposed between the first microfluidic chamber and the second chamber. The first liquid permeability is substantially different from the second liquid permeability.

In another separate aspect of the invention, a first method for combining microscale volumes of at least two different fluids includes several steps. A first step is providing a microfluidic device having a microfluidic chamber bounded by a first device layer and by a deformable membrane. A second step is engaging a portion of the deformable membrane to the first device layer to partition the microfluidic chamber into a first subchamber and a second subchamber. A third step is filling the first subchamber with a first fluid and filing the second subchamber with a second fluid. A fourth step is disengaging the deformable membrane from the first device layer.

In another separate aspect of the invention, a second method for combining microscale volumes of at least two different fluids includes multiple steps. A first step is providing a microfluidic device having a chamber bounded along a surface by a deformable membrane, having multiple microfluidic channels for supplying different fluids to the chamber. A second step is manipulating the deformable membrane to disallow fluid communication between a first microfluidic channel and the chamber, and to disallow fluid communication between a second microfluidic channel and the chamber. A third step includes filling the first microfluidic channel with a first fluid, and filling the second microfluidic channel with a second fluid. A fourth step is manipulating the deformable membrane to permit the first fluid and the second fluid to enter the microfluidic chamber.

In another separate aspect of the invention, any of the foregoing aspects may be combined for additional advantage. These and other aspects and advantages of the invention will be apparent to the skilled artisan upon review of the following detailed description, drawings, and claims.

BRIEF DESCRIPTION OF THE DRAWINGS

FIG. 1A is a top view of a microfluidic device capable of metering discrete amounts of two fluids in subchambers disposed in different layers, and then combining the contents of the subchambers to yield one fluidic combination. FIG. 1B is an expanded top view of the central portion of the device of FIG. 1A. FIG. 1C is a cross-sectional view of a portion of the device of FIG. 1A along section lines "A"-"A" shown in FIG. 1B.

FIG. 2A is an exploded perspective view of a five-layer microfluidic device capable of combining discrete amounts of up to four fluids to yield up to four fluidic combinations. FIG. 2B is a top view of the assembled device of FIG. 2A.

FIG. 3A is a top view of a three-layer microfluidic device capable of metering discrete amounts of two fluids in subchambers disposed in the same layer, and then combining the contents of the subchambers to yield one fluidic combination. FIG. 3B is a top view of the device of FIG. 3A illustrating section lines "B"-"B". FIG. 3C is a cross-sectional view of a portion of the device of FIGS. 3A-3B along section lines "B"-"B". FIG. 3D is a top view of the device of FIGS. 3A-3B following a laser heating step to partition the central chamber into two subchambers. FIG. 3E is a top view of the device of FIG. 3D illustrating section lines "C"-"C". FIG. 3F is a cross-sectional view of a portion of the device of FIG. 3E along section lines "C"-"C".

FIG. 4A is a top view of a five-layer microfluidic device capable of metering discrete amounts of two fluids in subchambers disposed in the same layer, and then combining the contents of the subchambers to yield one fluid combination. FIG. 4B is a top view of the device of FIG. 4A, illustrating section lines "D"-"D". FIG. 4C is a cross-sectional view of a portion of the device of FIGS. 4A-4B along section lines "D"-"D", the device having one unpartitioned chamber. FIG. 4D provides the same view as FIG. 4C, except that the device chamber is partitioned by deflection of a portion of the lower deformable layer to contact an adhesive surface in a central device layer.

FIG. 13A is a side cross-sectional view of a portion of a microfluidic device positioned in proximity to a magnetic actuator, the device having a multi-layer deformable membrane with an integral ferromagnetic or paramagnetic region and the membrane being in a retracted position. FIG. 13B provides the same view as FIG. 13A, except that the multi-layer deformable membrane is in an extended position to block fluid flow through a portion of the device.

DETAILED DESCRIPTION OF PREFERRED EMBODIMENTS OF THE INVENTION

Definitions

Figure 5A:
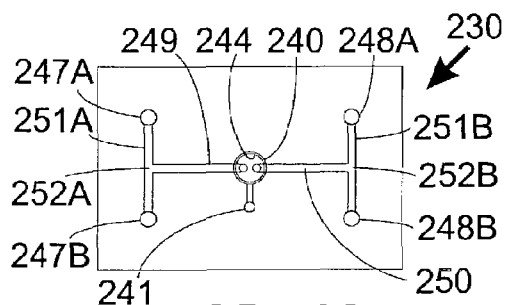
FIG. 5A is a top view of an eight-layer microfluidic device capable of combining discrete amounts of two fluids, the device including a deformable membrane that controls the admission of the fluids into a central chamber.

The terms "channel" or "chamber" as used herein is to be interpreted in a broad sense. Thus, such terms are is not intended to be restricted to elongated configurations where the transverse or longitudinal dimension greatly exceeds the diameter or cross-sectional dimension. Rather, such terms are meant to comprise cavities or tunnels of any desired shape or configuration through which liquids may be directed. Such a fluid cavity may, for example, comprise a flow-through cell where fluid is to be continually passed or, alternatively, a chamber for holding a specified, discrete amount of fluid for a specified amount of time. "Channels" and "chambers" may be filled or may contain internal structures comprising, for example, valves, filters, and similar or equivalent components and materials.

The term "flexible" as used herein means able to endure strain, particularly due to being bent, folded, or stretched, without breaking or suffering permanent injury. "Flexible" as used herein may or may not include the further properties of being resilient or elastic.

The term "microfluidic" as used herein refers to structures or devices through which one or more fluids are capable of being passed or directed, and which have at least one dimension less than about 500 microns.

The term "substantially sealed" as used herein refers to a microstructure having a sufficiently low unintended leakage rate and/or volume under given flow, fluid identity, and pressure conditions. A substantially sealed device may include one or more inlet ports and/or outlet ports.

The term "self-adhesive tape" as used herein refers to a material layer or film having an integral adhesive coating on one or both sides.

The term "stencil" as used herein refers to a material layer or sheet that is preferably substantially planar through which one or more variously shaped and oriented portions have been cut or otherwise removed through the entire thickness of the layer, and that permits substantial fluid movement within the layer (e.g., in the form of channels or chambers, as opposed to simple through-holes for transmitting fluid through one layer to another layer). The outlines of the cut or otherwise removed portions form the lateral boundaries of microstructures that are formed when a stencil is sandwiched between other layers such as substrates or other stencils.

The term "synthesis" as used herein refers to molecular rearrangement, addition, or subtraction of molecular species, generally including either chemical or biological transformation. Biological transformations include bioanalytical methods for the detection and quantification of molecular species of interest, also referred to herein as bioassays or assays.

Microfluidic Devices Generally

In an especially preferred embodiment, microfluidic devices according to the present invention are constructed using stencil layers or sheets to define channels and/or chambers. As noted previously, a stencil layer is preferably substantially planar and has a channel or chamber cut through the entire thickness of the layer to permit substantial fluid movement within the stencil layer. Various means may be used to define such channels or chambers in stencil layers. For example, a computer-controlled plotter modified to accept a cutting blade may be used to cut various patterns through a material layer. Such a blade may be used either to cut sections to be detached and removed from the stencil layer, or to fashion slits that separate regions in the stencil layer without removing any material. Alternatively, a computer-controlled laser cutter may be used to cut portions through a material layer. While laser cutting may be used to yield precisely-dimensioned microstructures, the use of a laser to cut a stencil layer inherently involves the removal of some material. Further examples of methods that may be employed to form stencil layers include conventional stamping or die-cutting technologies, including rotary cutters and other high throughput auto-aligning equipment (sometimes referred to as converters). The above-mentioned methods for cutting through a stencil layer or sheet permits robust devices to be fabricated quickly and inexpensively compared to conventional surface micromachining or material deposition techniques that are conventionally employed to produce microfluidic devices.

After a portion of a stencil layer is cut or removed, the outlines of the cut or otherwise removed portions form the lateral boundaries of microstructures that are completed upon sandwiching a stencil between substrates and/or other stencils. The thickness or height of the microstructures such as channels or chambers can be varied by altering the thickness of the stencil layer, or by using multiple substantially identical stencil layers stacked on top of one another. When assembled in a microfluidic device, the top and bottom surfaces of stencil layers are intended to mate with one or more adjacent layers (such as stencil layers or substrate layers) to form a substantially enclosed device, typically having at least one inlet port and at least one outlet port.

A wide variety of materials may be used to fabricate microfluidic devices having sandwiched stencil layers, including polymeric, metallic, and/or composite materials, to name a few. In certain embodiments, particularly preferable materials include those that are substantially optically transmissive to permit viewing and/or electromagnetic analyses of fluid contents within a microfluidic device. Various preferred embodiments utilize porous materials including filter materials. Substrates and stencils may be substantially rigid or flexible. Selection of particular materials for a desired application depends on numerous factors including: the types, concentrations, and residence times of substances (e.g., solvents, reactants, and products) present in regions of a device; temperature; pressure; pH; presence or absence of gases; and optical properties.

Various means may be used to seal or bond layers of a device together, preferably to construct a substantially sealed structure. For example, adhesives may be used. In one embodiment, one or more layers of a device may be fabricated from single- or double-sided adhesive tape, although other methods of adhering stencil layers may be used. A portion of the tape (of the desired shape and dimensions) can be cut and removed to form channels, chambers, and/or apertures. A tape stencil can then be placed on a supporting substrate with an appropriate cover layer, between layers of tape, or between layers of other materials. In one embodiment, stencil layers can be stacked on each other. In this embodiment, the thickness or height of the channels within a particular stencil layer can be varied by varying the thickness of the stencil layer (e.g., the tape carrier and the adhesive material thereon) or by using multiple substantially identical stencil layers stacked on top of one another. Various types of tape may be used with such an embodiment. Suitable tape carrier materials include but are not limited to polyesters, polycarbonates, polytetrafluoroethlyenes, polypropylenes, and polyimides. Such tapes may have various methods of curing, including curing by pressure, temperature, or chemical or optical interaction. The thicknesses of these carrier materials and adhesives may be varied.

Notably, stencil-based fabrication methods enable very rapid fabrication of devices, both for prototyping and for high-volume production. Rapid prototyping is invaluable for trying and optimizing new device designs, since designs may be quickly implemented, tested, and (if necessary) modified and further tested to achieve a desired result. The ability to prototype devices quickly with stencil fabrication methods also permits many different variants of a particular design to be tested and evaluated concurrently.

Further embodiments may be fabricated from various materials using well-known techniques such as embossing, stamping, molding, and soft lithography.

In addition to the use of adhesives and the adhesiveless bonding method discussed above, other techniques may be used to attach one or more of the various layers of microfluidic devices useful with the present invention, as would be recognized by one of ordinary skill in attaching materials. For example, attachment techniques including thermal, chemical, or light-activated bonding steps; mechanical attachment (such as using clamps or screws to apply pressure to the layers); and/or other equivalent coupling methods may be used.

PREFERRED EMBODIMENTS

Various microfluidic devices for combining discrete volumes of at least a first fluid and at least a second fluid are provided herein. Notably, as used herein, discrete volumes are intended to refer to fluid plugs, not flowing streams of indeterminate volume. In most cases, the first fluid and the second fluid are preferably both liquids.

Certain embodiments herein utilize deformable membranes. A system can be constructed in which deformation of the material results in either partial blockage or substantially complete blockage of a fluid flow path in response to a change in relative pressure. An elastic material can be used where reversible control of fluid flow is desired. Lowering the pressure in the higher relative pressure channel segment allows the deformable membrane to resume its neutral state, allowing unrestricted fluid flow. In some cases, it is desirable for the change in the microfluidic channel segment to be substantially permanent or irreversible. Such uses include shut-off valves to protect downstream components from damage caused by high flow or pressure. Upon increase in pressure in one channel segment, an inelastic material will be deformed towards the channel segment with lower pressure. The material can remain substantially in the deformed position for a prolonged period.

A deformable membrane also can be made of materials with surface properties that alter its behavior. For example, a membrane can be tacky or have an adhesive coating. Such properties or coatings can be applied to one or both sides of the deformable membrane. Depending on the strength of the adhesive or degree of tackiness, the deformable membrane can operate as a variable switch. At low relative pressures, the membrane can act elastically. At high pressures, or for systems designed for the deformable membrane to physically contact the opposing wall of the adjacent channel segment, the deformation can result in a permanent closure of the adjacent channel segment. In another embodiment, the membrane used can be non-adhesive, but the surface against which it seals can be constructed with a tacky or adhesive surface. The degree of permanence of the closure relates to the elasticity of the membrane and the strength of the adhesive material used. Examples of the inelastic system include but are not limited to situations where the material is semi-malleable, for example, a metal foil, and situations where one or both of the surfaces have permanent or semi-permanent adhesives.

In one embodiment, a microfluidic device includes two adjacent microfluidic chambers that are separated by an intermediate device layer such as a membrane. The intermediate layer defines a rupture region that prevents interchamber fluid flow under certain conditions, but permits such flow under other conditions. For example, the rupture region may include a perforated region, a scored region, a slit, an aperture provided in a different configuration, or another type of a frangible seal. The rupture region may be weakened by conventional mechanical, chemical, and/or electromagnetic treatment to construct a frangible seal. Disposable masks may be added to the intermediate layers during construction to ensure that any weakening treatments are confined to desired regions.

If the fluids to be added to the chambers are aqueous, then an intermediate layer having an aperture may be formed with or coated with a hydrophobic material to prevent inadvertent passage of fluid between the adjacent chambers, so as to permit the chambers to be filled without interchamber fluid migration. A pressure gradient can then be applied to force fluid through the aperture in the hydrophobic layer to combine the two plugs. In a preferred embodiment, the hole is actually a slit in which no material is removed from the intermediate dividing layer. In a more preferred embodiment, the slit is formed using a blade or die, rather than a laser, to minimize the removal of material from the intermediate layer.

Referring to FIGS. 1A-1C, a simple microfluidic device 140 for combining discrete volumes of two different fluids may be constructed from five device layers. Along the top of the device 140, the first layer 141 defines four fluid ports 142A, 142B, 143A, 143B, a pair of ports each being associated with one of two microfluidic channels 144, 147. A first microfluidic channel 144 defined in the second layer 145 delivers fluid to a first microfluidic chamber 146, and second microfluidic channel 147 defined in the fourth layer 148 intersects the first channel 144 and delivers fluid to a second microfluidic chamber 149. The first and second chambers 146,149 are separated by the third layer 150, in which a rupture region or slit 151 is defined along the boundary between the two chambers 146, 149. A fifth layer 152 defines the lower boundary of the second chamber 149. In a preferred embodiment, the first and fifth layers 141, 152 are made of a polymeric film, the second layer 145 is made of a double-sided tape, the third layer 150 is made of single-sided tape with the adhesive facing down, and the fourth layer 148 is made of single- or double-sided tape.

In operation, a discrete volume or "plug" of a first fluid is formed in the first chamber 146 when the first channel 144 is filled, and a second fluid plug in the second chamber 149 is formed when the second channel 147 is filled. The slit 151 in the third layer 150 is held shut by the adhesive on the bottom side of the third layer 150. Once the plugs are formed, the ports 142, 143 to each channel 144, 147 are sealed (such as by heat sealing, covering with an self-adhesive film, or an equivalent). The volumes of the fluid plugs are defined by the chambers 146, 149 and any fluids remaining in the channels 144, 147 between the chambers 146, 149 and the channel seals. Each chamber 146, 149 has a volume of preferably less than about 2 microliters, and more preferably less than about 1 microliter. Following the fluid filling and channel sealing steps, the slit 151 in the third layer 150 is ruptured, breaking the rupture region 151 between the chambers 146, 149 to allow the plugs to diffuse together. This rupture may be advantageously accomplished by bending the device 140 along the direction of the slit 151. Alternatively, establishing a pressure differential between the chambers 146, 149 can rupture the rupture region 151.

One advantage of the design according to FIGS. 1A-1C is that it can be expanded to include a large number microfluidic chambers without adding further layers or complexity. For example, FIGS. 2A-2B show a microfluidic device 160 for combining discrete fluid volumes to yield up to four different combinations, with two groups of four chambers defined in different layers and disposed in a 2×2 array. The device 160 shares the same basic five-layer design as the device 140 shown in FIGS. 1A-1C. However, the device 160 has four channels 161A, 161B, 162A, 162B in communication with four inlet ports 163A and four outlet ports 163B defined in the first layer 155, four chambers 164A-164D in the second layer 156, four chambers 166A-166D in the fourth layer 158, and multiple rupture regions 165A, 165B defined in the third layer 157. Different fluids may be added to each of the four channels 161A, 161B, 162A, 162B. The chambers 164A-164D, 166A-166D can then be sealed from the channels 161A, 161B, 162A, 162B. For example, a heat probe (not shown) may be used to locally seal the channels 161A, 161B, 162A, 162B such as by locally melting the outermost device layers 155, 159 along the channels 161A, 161B, 162A, 162B. Thereafter, the rupture regions 165A, 165B may be ruptured to permit fluids in the chambers 164A-164D defined in the second layer 156 to combine with fluids in the chambers 166A-166D defined in the fourth layer 158. If different fluids are provided to each of the four channels 161A, 161B, 162A, 162B, then after the rupture regions 165A, 165B are ruptured, different fluid combinations will be contained in each of the four fluidically coupled "composite" mixing chambers 164A-166A, 164B-166B; 164C-166C, 164D-166D. Microfluidic devices that have many more and/or more densely packed mixing chambers for combining many fluids may be prepared according to the same basic design.

In another embodiment, a microfluidic device for combining discrete fluid volumes includes a microfluidic chamber that may be non-permanently partitioned into a first discrete subchamber and a second discrete subchamber. Referring to FIGS. 3A-3F, a microfluidic device 170 is formed in three layers. The first layer 171 has four ports 174A, 174B, 175A, 175B, two ports 174A, 174B of which are in fluid communication with a first microfluidic channel 176, and two ports 175A, 175B of which are in fluid communication with a second microfluidic channel 177. The second layer 172 defines both channels 176, 177 and a chamber 178 capable of connecting the channels 176, 177. Preferably, the first and third layers 171, 173 are formed with a thermoplastic polymeric film or coated with a thermoplastic polymer, and the second layer 172 is a double-sided tape. To partition the chamber 178, the first layer 171 may be locally heated along a line 179 bisecting the chamber 178, causing the thermoplastic material to melt locally without cutting through the first layer 171. A laser (not shown) is preferably used for this purpose (using a technique called laser welding in which the material is locally melted but not substantially ablated), although other conventional localized heating techniques such as ultrasonic heating, electrical resistance heating (using electrodes (not shown) disposed on or within the first layer 171), and/or contact heating may be used to achieve the same result. Using any of these techniques, the first layer 171 may be weakly bonded to the third layer 173 along the path 179 of the localized heating or "welding." FIGS. 3A-3B show top views and FIG. 3C shows a cross-sectional view along section lines "B"-"B" (illustrated in FIG. 3B) of a chamber 178 before laser welding. FIGS. 3D-3F show these views after the chamber 178 is partitioned.

The bond between portions of the first and third layers 171, 173 due to the localized heating step is preferably non-permanent (i.e., weak). Following localized heating to partition the chamber 178, the two resulting sub-chambers 178A, 178B are filled with different fluids. To enable the fluids to be combined, there exist several different ways of breaking the seal partitioning the chamber 178. In one embodiment, the fluidic ports 174A, 174B, 175A, 175B are sealed, such as by localized heating with a heat probe (not shown), and the seal between the subchambers 178A, 178B is broken by applying an external force or pressure to the chamber 178. In another embodiment, all but one of the fluidic ports 174A, 174B, 175A, 175B are sealed. The unsealed port is then used to supply pressure from an external source (not shown). In yet another embodiment, all fluidic ports 174, 175 are sealed and an external suction or vacuum is applied above the partitioning seal to break the seal and eliminate the barrier between subchambers 178A, 178B.

In a similar embodiment, a chamber may be partitioned into multiple subchambers with an adhesive bond. Referring to FIGS. 4A-4D, a microfluidic device 180 for combining discrete fluid volumes is formed in five layers 181-185. The first layer 181 is preferably a rigid substrate and defines two fluidic inlet ports 186A, 187A and two fluidic outlet ports 186B, 187B. One set of ports 186A, 186B is in fluid communication with a first channel 188 and the chamber 191 defined in the fourth layer, and the other set of ports 187A, 187B is in fluid communication with a second channel 189 and the chamber 191 defined in the fourth layer. The second layer 182 is preferably a double-sided tape. The third layer 183 is preferably a non-adhesive film defining a cutout region 190 that bounds at least part of the chamber 191. The fourth layer 184 is preferably a double-sided adhesive defining a portion of the chamber 191 below the cutout 190 defined in the third layer 183. The fifth layer 185 is preferably a deformable membrane such as a flexible polymeric film. To partition the chamber 191 into two sub-chambers 191A, 191B, the fifth layer 185 is deformed upward to engage an exposed adhesive region along the cutout 190 bounding the central channel 191 from above. Once engaged, a portion of the fifth layer 185 locally adheres to the adhesive lower surface of the second layer 182, thus separating the chamber 191 into two subchambers 191A, 191B. FIG. 4C shows a cross-sectional view of the chamber 191 (along section lines "D"-"D" illustrated in FIG. 4B) before partitioning, and FIG. 4D shows this same view but after the chamber 191 is partitioned into two subchambers. The resulting adhesive bond between portions of the second and fifth layers 182, 185 is weak, but maintains fluidic separation between the two subchambers 191A, 191B at low fluid pressures. Following formation of the subchambers 191A, 191B, fluid can then be filled independently into both subchambers. As was the case with the heat-sealed devices, several methods may be used to break the seal. In one embodiment, the fluidic ports 186A, 186B, 187A, 187B are sealed and the seal partitioning the subchambers 191A, 191B is broken by applying pressure to one of the subchambers 191A, 191B. In another embodiment, all but one of the fluidic ports 186A, 186B, 187A, 187B are sealed. The open port is then used to supply pressure from an external source (not shown). In yet another embodiment, all inlet and outlet ports 186A, 186B, 187A, 187B are sealed, and an external suction or vacuum is applied adjacent to the deformable membrane layer 185 to disengage or break the partition seal.

In a preferred embodiment, an additional channel is defined in a sixth layer (not shown) and enclosed by a seventh layer (not shown) and placed below the fifth layer 185 along the adhesive seal region. Pressure can be applied to the sixth channel to deform the third layer so as to partition the chamber, and vacuum can then be applied to disengage or break the seal.

In another embodiment configured similarly to those described immediately above, a clamp (not shown) is used to partition a chamber by pinching it closed along a centerline to permit multiple subchambers to be filled, and then the clamp is released to allow the two plugs to mix.

Figure 14:
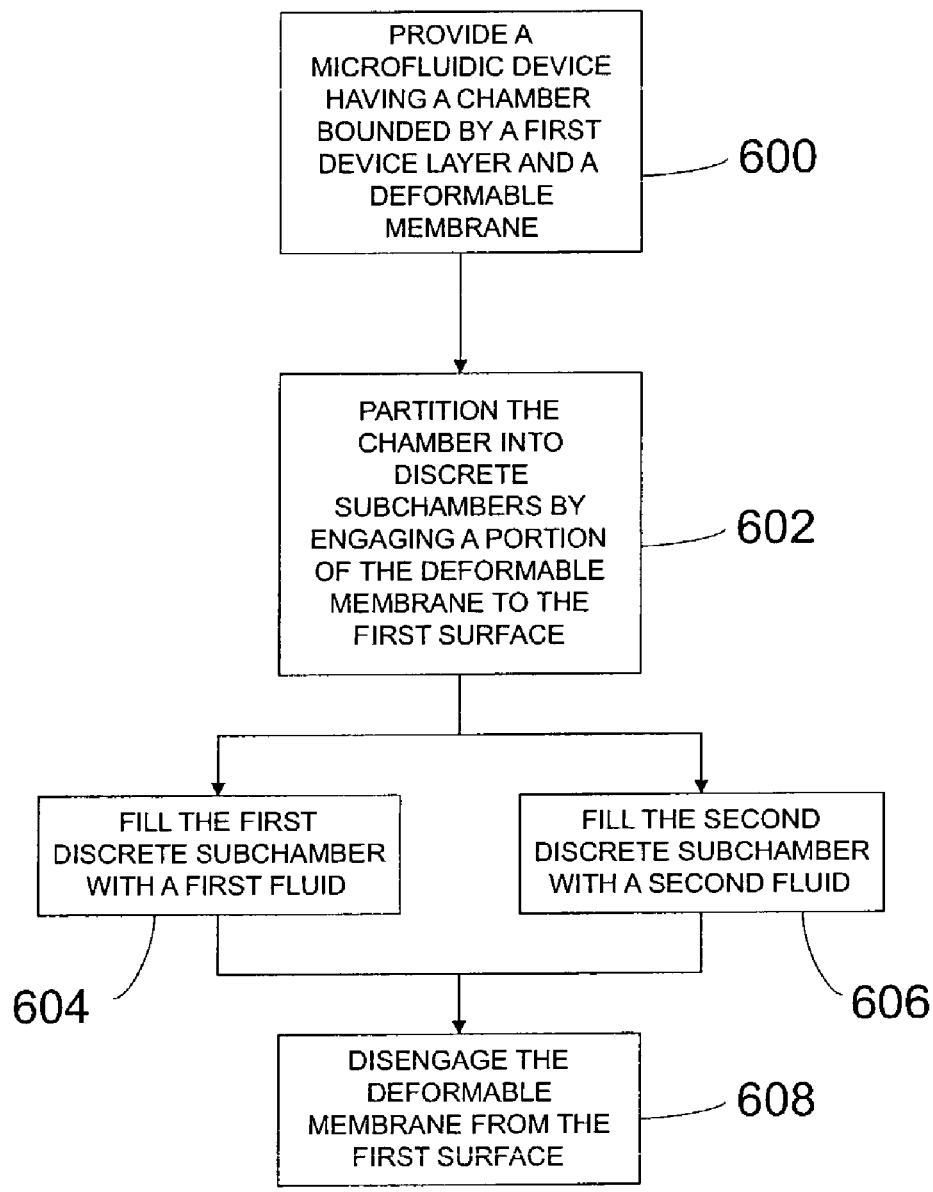
FIG. 14 is a flow chart outlining the steps for performing a first method for combining discrete volumes of a first fluid and a second fluid in a microfluidic device.

FIG. 14 illustrates the steps of a preferred method for combining discrete fluid volumes that may utilize microfluidic devices such as those illustrated in FIGS. 3A-3F or FIGS. 4A-4D. A first step 600 includes providing a microfluidic device (e.g., devices 170, 180 described previously) having a microfluidic chamber bounded by a first device layer and by a deformable membrane. A second step 602 includes partitioning the chamber into discrete subchambers by engaging a portion of the deformable membrane to the first surface. The next steps 604, 606 may be performed sequentially or substantially simultaneously; they include filling the first discrete subchamber with a first fluid and filing the second discrete subchamber with a second fluid. A subsequent step 608 includes disengaging the deformable membrane from the first device layer.

Figure 5B:
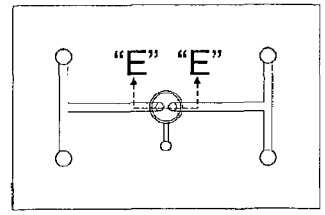
FIG. 5B is a top view of the device of FIG. 5A, illustrating section lines "E"-"E".
Figure 5C:
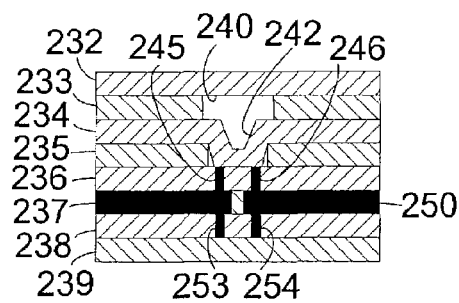
FIG. 5C is a cross-sectional view of a portion of the device of FIGS. 5A-5B along section lines "E"-"E" with the deformable membrane in an extended position to prevent the admission of two fluids into a central chamber.
Figure 5D:
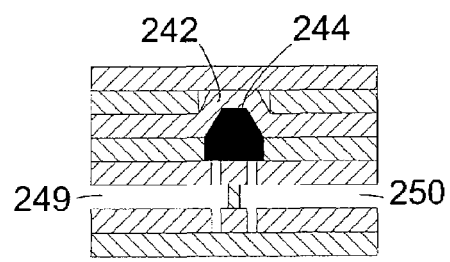
FIG. 5D provides the same view as FIG. 5C, except that the deformable membrane is in a retracted position to permit the two fluids to enter the central chamber.

In another embodiment, a microfluidic device for combining discrete fluid volumes may be fabricated with a "collapsible" chamber bounded by a deformable membrane, wherein the volume of the chamber may be altered by deforming the membrane using pneumatic, magnetic, or equivalent. Preferably, the chamber is initially collapsed to prevent fluid from entering the chamber, and then the chamber volume is expanded to open the chamber and simultaneously draw fluid plugs into the chamber. For example, referring to FIGS. 5A-5D, a microfluidic device 230 for combining discrete fluid volumes is fabricated in eight layers. FIGS. 5A-5B show top views of the device 230, and FIGS. 5C-5D provide cross-sectional views along section lines "E"-"E" (illustrated in FIG. 5B) of a portion of the device 230 in operation. Preferably, the first layer 232 is a rigid substrate, the second, fourth, and sixth layers 233, 235, 237 are constructed with double-sided tape, the third layer 234 is a deformable membrane film such as latex, the fifth layer 236 is constructed with a non-adhesive film, the seventh layer 238 is constructed with single-sided tape with the adhesive side facing down, and the eighth layer 239 is constructed with a hydrophobic porous membrane. The second layer 233 defines an actuation chamber 240 that may be de-pressurized and/or pressurized by an external source (not shown) connected to the device 230 at an actuation port 241 to deform the unrestrained portion 242 of the deformable membrane forming the third layer 234. Below the unrestrained portion 242 of the third layer membrane is a fluid chamber 244 defined in the fourth layer 235. Defined in the fifth layer 236 at the lower boundary of the mixing chamber 244 are fluidic inlet apertures 245, 246 for delivering fluid plugs to the fluid chamber 244, the plugs being supplied to the device 230 through external ports 247, 248 in communication with fluidic channels 251 in the sixth layer 237. Downward deformation of the unrestrained portion 242 covers the fluidic inlet apertures 245, 246 to prevent fluidic access to the chamber 244.

In operation, pressure is initially applied to the actuation chamber 240 to deform the unrestrained portion 242 so as to cover the fluidic inlet apertures 245, 246 and prevent fluidic access to the chamber 244. With the sample chamber 244 closed, a first fluid and a second fluid are supplied to the device 230 through inlet ports 247A, 248A into fluid channels 251A, 251B along either side of the device 230. Each inlet channel 251A, 251B has an associated junction 252A, 252B and a branch channel 249, 250. A first fluid supplied to one port 247A fills the first channel 251A and the first branch channel 249. A second fluid supplied to the other port 247B fills the second channel 251B and the second branch channel 250. Vent regions 253, 254 providing fluid communication between the branch channels 249, 250 and the porous eighth layer 239 permit the advancing fluids to displace any air from the branch channels 249, 250. Once filled, fluid in the branch channel segments 249, 250 may be isolated into plugs of discrete volume by purging the channels 251A, 251B, such as by using pressurized air or nitrogen. Once the plugs in the branch channels are formed, vacuum is applied to the actuation chamber 240 to cause the unrestrained portion 242 of the deformable membrane 234 to deflect upward, thus opening the sample chamber 244. Referring to FIG. 5D, upward deflection of the unrestrained portion 242 creates a vacuum in the sample chamber 244 that draws the plugs of the first fluid and the second fluid into the sample chamber 244 to enable the plugs to be combined. Once within the chamber 244, the plugs will gradually mix due to diffusion. Mixing may be accelerated by the addition of energy, such as by agitating the device 230, applying a sonic (e.g., ultrasonic) horn (not shown) adjacent to the sample chamber 244, including a magnetic particle (not shown) in the chamber 244 and moving the particle with an external magnetic field, or other mixing means.

Figure 6A:
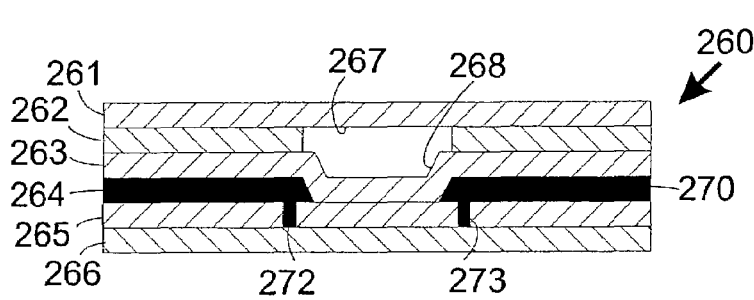
FIG. 6A is a cross-sectional view of at least a portion of a six-layer microfluidic device capable of combining discrete amounts of two fluids, the device including a deformable membrane illustrated in an extended position to prevent the admission of fluids into a central chamber.
Figure 6B:
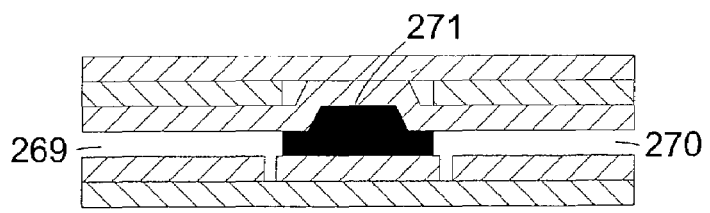
FIG. 6B provides the same view as FIG. 6A, except that the deformable membrane is in a retracted position to permit the two fluids to enter the central chamber.

In a further embodiment utilizing a deformable membrane, two fluid plugs are formed behind a deformed membrane, and the application of pressure behind the samples opens the mixing chamber and permits the samples to be combined. Referring to FIGS. 6A-6B, which are cross-sectional views of a portion 260 of a microfluidic device for combining discrete fluid volumes, the device 260 is formed in six layers 261-266. Preferably, the first layer 261 is a rigid substrate, the second and fourth layers 262, 264 are double-sided tape, the third layer 263 is a deformable membrane such as 4-mil thick latex, the fifth 265 layer is single-sided tape with the adhesive facing down, and the sixth layer 266 is a hydrophobic porous membrane. The second layer 262 defines an actuation chamber 267 and the fourth layer 264 defines a sample chamber 271, with the two chambers 264, 267 separated by an unrestrained portion 268 of the deformable membrane 263. Fluidic channel segments 269, 270 defined in the fourth layer 264 transport fluid to the boundaries of the sample chamber 271. Vents 272, 273 are defined in the fifth layer 266 to permit air entrained in the channel segments 269, 270 to be displaced by the fluids as they fill toward the sample chamber 271.

In operation, the actuation chamber 267 is initially pressurized from an external source (not shown) to deform the unrestrained portion 268 of the deformable membrane 263 downward to close (or collapse) the sample chamber 271, as shown in FIG. 6A. The first channel segment 269 is then filled with a first fluid, and the second channel segment 270 is filled with a second fluid. The two fluids are permitted to flow up to the collapsed unrestrained portion 268 of the membrane 263 due to the vents 272, 273 which ventilate any air ahead of the advancing fluids. Once liquid plugs are formed in the channel segments 269, 270, the pressure in the actuation chamber 267 is released or at least reduced. However, vacuum is preferably not applied to the vacuum pulled, so the sample chamber 271 remains collapsed. The channel segments 269, 270 are then pressurized, such as by applying a pressurized gas in one or more upstream regions (not shown). The first fluid plug and the second fluid plug then enter the mixing chamber 271 and displace the deformable membrane 268 upward, as depicted in FIG. 6B. Once each plug is present in the sample chamber 271, the pressurized gas applied behind each plug escapes through the vents 272, 273, and the first liquid plug and the second liquid plug remain in the chamber 271 to be combined.

Figure 15:
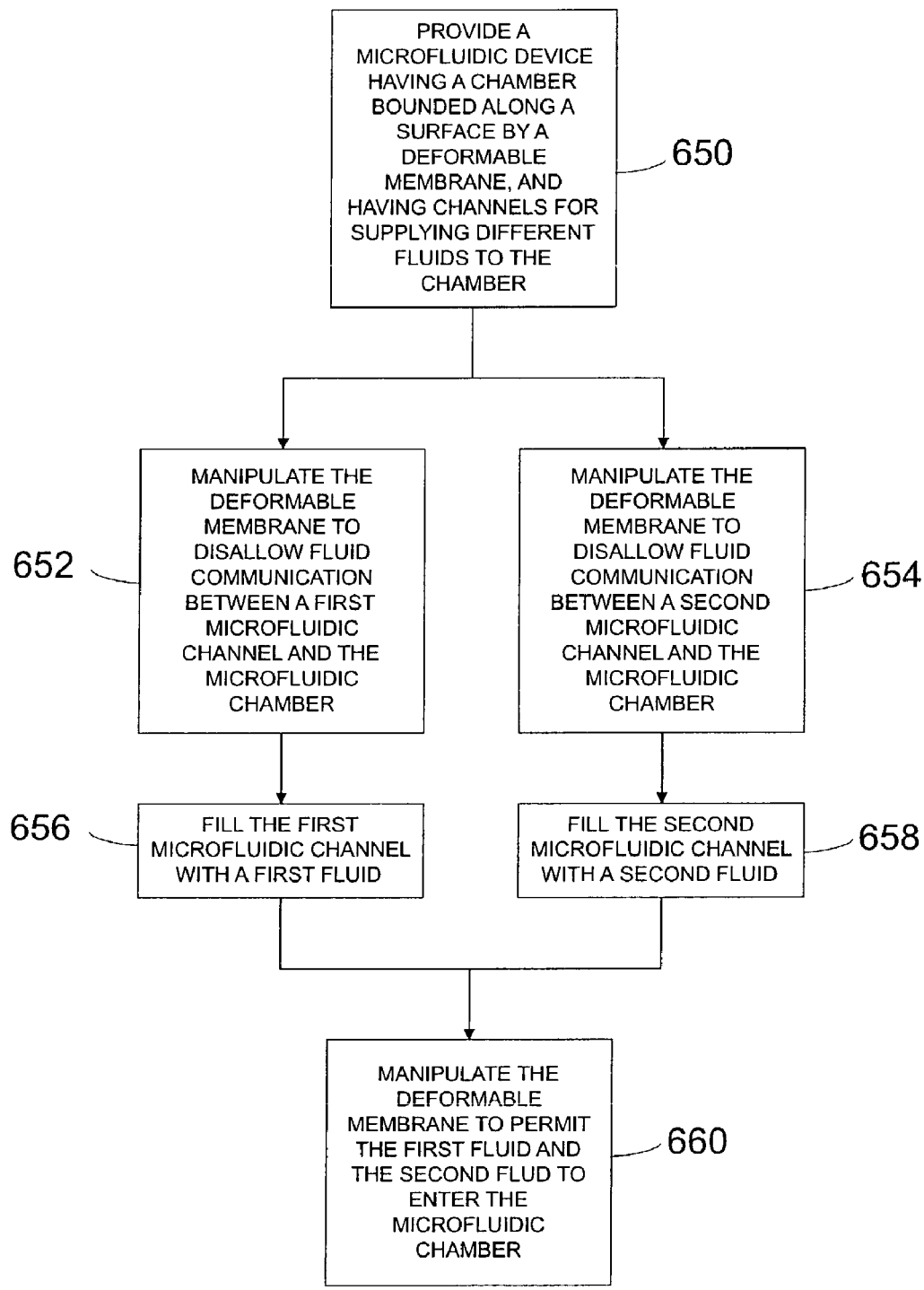
FIG. 15 is a flow chart outlining the steps for performing a second method for combining discrete volumes of a first fluid and second fluid in a microfluidic device.

FIG. 15 illustrates the steps of a preferred method for combining discrete fluid volumes that may utilize microfluidic devices such as those illustrated in FIGS. 5A-5B (or other embodiments disclosed herein). A first step 650 includes providing a microfluidic device having a chamber bounded along a surface by a deformable membrane, having multiple microfluidic channels for supplying different fluids to the chamber. The next steps 652, 654 may be performed sequentially or substantially simultaneously; they include manipulating the deformable membrane to disallow fluid communication between a first microfluidic channel and the chamber, and manipulating the deformable membrane to disallow fluid communication between a second microfluidic channel and the chamber. The following steps 656, 658 again may be performed sequentially or substantially simultaneously; they include filling the first microfluidic channel with a first fluid, and filling the second microfluidic channel with a second fluid. A further step 660 includes manipulating the deformable membrane to permit the first fluid and the second fluid to enter the microfluidic chamber.

Figure 7A:
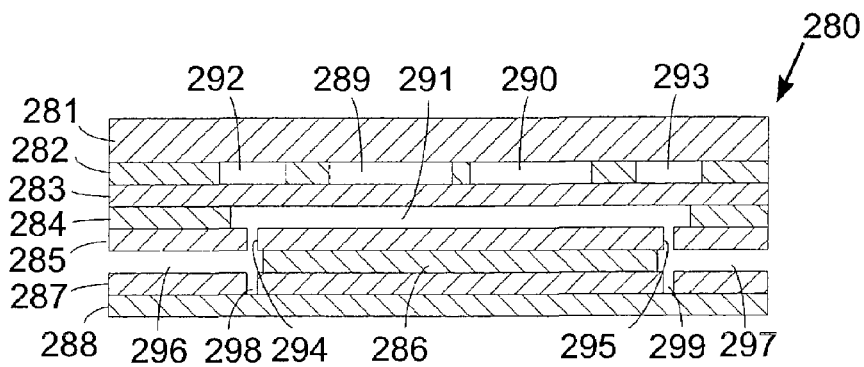
FIG. 7A is a cross-sectional view of at least a portion of an eight-layer microfluidic device capable of combining discrete amounts of two fluids, the device including a flexible membrane capable of deformation in multiple regions.

In another embodiment, multiple collapsible chambers are used within a microfluidic device to minimize the presence of air in a sample chamber intended to receive fluids to be combined. Referring to FIGS. 7A-7G, one example of such a microfluidic device 280 is constructed in eight layers 281-289. Preferably, the first layer 281 is a rigid substrate; the second, fourth, and sixth layers 282, 284, 286 are constructed with double-sided tape; the third layer 283 is formed with a deformable membrane such as latex; the fifth layer 285 is constructed with a non-adhesive film; the seventh layer 287 is constructed with a single-sided tape having the adhesive side down; and the eighth layer 288 is a porous film. More preferably, the eighth layer 288 is also hydrophobic. The second layer 282 defines two medial actuation chambers 289, 290 disposed above a sample chamber 291 (defined in the fourth layer 284), and also defines two lateral actuation chambers 292, 293 disposed above fluidic apertures 294, 295 defined in the fifth layer 285. The fluidic apertures 294, 295 are capable of communicating fluids from the channel segments 296, 297 to the sample chamber 291 when the lateral actuation chambers 292, 293 are not pressurized cause the deformable membrane 283 bounding the lateral chambers 292, 293 to cover the apertures 294, 295. FIG. 7A shows a cross-sectional view of the microfluidic device 280 before any action is initiated.

Figure 7B:
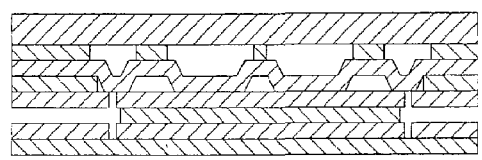
FIGS. 7B-7G provide cross-sectional views of the device of FIG. 7A in various states of operation to combine discrete amounts of two fluids.
Figure 7C:
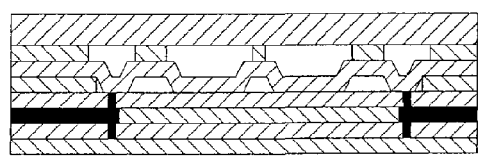

Referring to FIG. 7B, to prepare for operating the microfluidic device 280, the central actuation chambers 289, 290 above the sample chamber 291 are first pressurized, preferably to approximately 10 psi, to locally deform the third layer membrane 283 to collapse the sample chamber 291. While lower pressures may be used, a pressure of approximately 10 psi has been found to provide effective sealing. The lateral actuation chambers 292, 293 positioned above the inlet apertures 294, 295 are then pressurized, preferably to approximately 10 psi, to seal the apertures 294, 295 to prevent fluid flow therethrough. The combined action of the lateral actuation chambers 292, 293, deformable third layer membrane 283, and apertures 294, 295 defined in the fifth layer 285 operate as membrane valves. The reason that the central actuation chambers 289, 290 are pressurized before the lateral actuation chambers 292, 293 is to minimize the entrapment of air in the sample chamber 291.

Figure 7D:
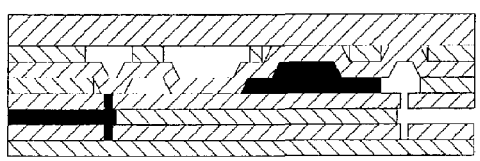
Figure 7E:
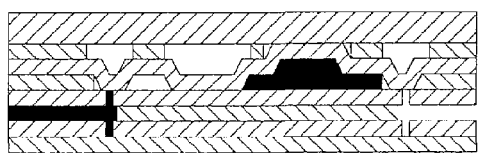
Figure 7F:
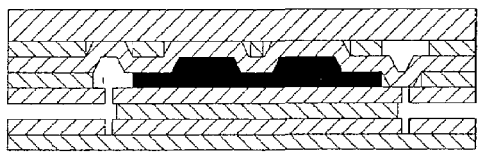
Figure 7G:
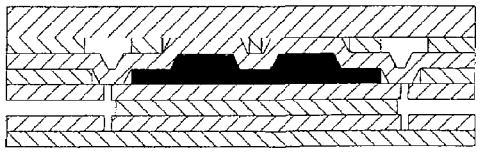

Following pressurization of all four actuation chambers 289, 290, 292, 293, a first fluid is introduced into the first channel segment 296 and a second fluid is introduced into the second channel segment 297 to form two discrete fluid plugs. As the fluid plugs are introduced into the channel segments 296, 297, any air present in the segments 296, 297 is displaced through the vents 298, 299 and the porous eighth layer 288. The discrete fluid plugs are then introduced into the sample chamber 291 one at a time. To introduce the first plug, a gas (e.g., nitrogen or air) pressurized to approximately 15 inches $H_2O$ is applied behind the first plug, then the first lateral actuation chamber 292 and the first central actuation chamber 290 are depressurized, permitting the first plug to flow into one half of the sample chamber 291, as shown in FIG. 7D. Following introduction of the first plug, the first lateral actuation chamber 293 is re-pressurized to seal the first plug into the sample chamber 291, as shown in FIG. 7E, thereby preventing escape or evaporation. The preceding two steps are then repeated for the second plug: the plug is pressurized from behind, the actuation chambers 292, 289 are opened (as shown in FIG. 7F), the plug enters the sample chamber 291, and the second actuation chamber 292 is re-pressurized to seal the sample chamber 291. The final state of the device 280, with the two fluid plugs present and sealed within the sample chamber 291 following to pressurization of the lateral actuation chambers 292, 293, is shown in FIG. 7G.

Figure 8A:
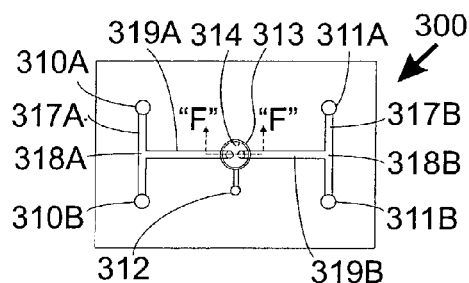
FIG. 8A is a top view of an eight-layer microfluidic device having integral porous membranes, the device being capable of combining discrete amounts of two fluids.
Figure 8B:
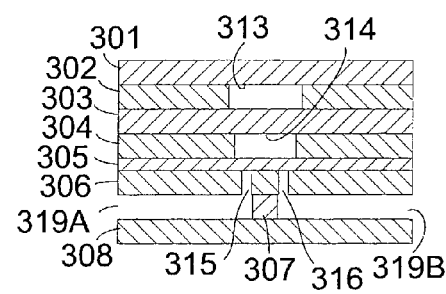
FIG. 8B is a cross-sectional view of a portion of the device of FIG. 8A along section lines "F"-"F".

In another embodiment, a liquid-permeable porous membrane is disposed between a sample chamber and an actuation chamber. Referring to FIGS. 8A-8B, a microfluidic device 300 is constructed with eight layers 301-308. FIG. 8A is a top view of the device 300, and FIG. 8B is a cross-sectional view of a portion of the device 300 along section lines "F"-"F" shown in FIG. 8A. The first layer 301 is a substrate defining fluidic ports 310A, 310B, 311A, 311B for communicating fluids to the device 300, and defining an actuation port 312 connected to an external vacuum source (not shown). Preferably, the second, fourth, and sixth layers 302, 304, 306 are constructed with double-sided self-adhesive tape; the third and fifth layers 303, 305 are hydrophobic (or, if the sample fluids are not aqueous, then similarly resistive to the particular fluid to be used) porous membranes; the seventh layer 307 is constructed with single-sided tape with the adhesive facing down; and the eighth layer 308 is constructed with a non-adhesive film. The second layer 302 defines an actuation chamber 313, the fourth layer 304 defines a sample chamber 314, and the sixth layer 306 defines fluidic inlet apertures 315, 316 that permit fluid communication between the channels 319A, 319B and the sample chamber 314. One function of the third layer 303 is to prevent liquid from entering the actuation chamber 313. Preferably, the fifth layer 303 has a greater liquid permeability than the third layer 303, such that fluid can pass through the fifth layer 303 at a lower threshold pressure than it can pass through the fifth layer 305. Examples of suitable porous materials include materials generally available from Porex Technologies (Fairburn, Ga.) and GORE-TEX®-type materials.

In operation of the device 300, a first fluid and a second fluid are supplied to the device 300 at low pressure through the external ports 310, 311 and communicated to inlet channels 317A, 317B. Preferably, the first fluid and the second fluid are liquids. A junction 318A, 318B in each inlet channel 317 permits each fluid to fill a branch channel segment 319A, 319B. Thereafter any residual first fluid in the first inlet channel 317A and any residual second fluid the second inlet channel 317B is purged by flushing these fluids with a pressurized gas that pushes the fluids from the inlet ports 310A, 311A to the outlet ports 310B, 311B so as to form discrete fluid plugs in the branch channels 319A, 319B (namely, a first fluid plug in the first branch channel 319A and a second fluid plug in the second branch channel 319B). The fifth layer 305 functions to stop plugs from entering the sample chamber 314 as the plugs are metered. In a preferred embodiment, the fifth layer 305 has a greater liquid permeability than the third layer 303 so that at a given threshold pressure, liquid can be drawn into the sample chamber 314, but is prevented from entering the actuation chamber 313. Vacuum is then applied to the actuation chamber 313 to draw the fluid plugs through the porous fifth layer 305 into the sample chamber 314, where the plugs are combined. Alternatively, the actuation chamber 314 can be vented to atmosphere and the first and second fluid plugs can be pressurized to push them through the porous fifth layer 305 into the sample chamber 314.

Figure 9A:
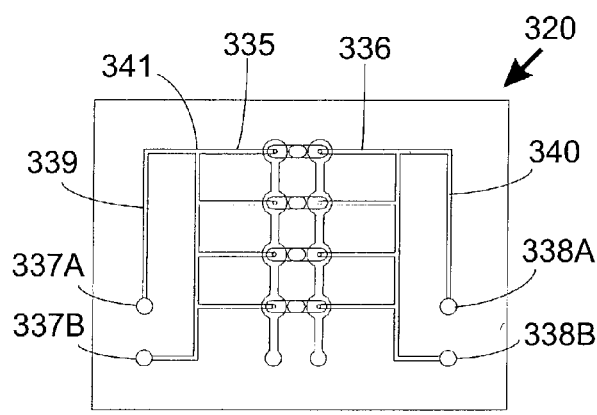
FIG. 9A is a top view of a multi-layer microfluidic device capable of combining metered amounts of two fluids to yield four discrete combinations.
Figure 9B:
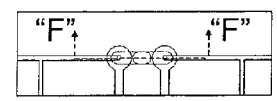
FIG. 9B is a top view of a portion of the device of FIG. 9A, illustrating section lines "G"-"G".
Figure 9C:
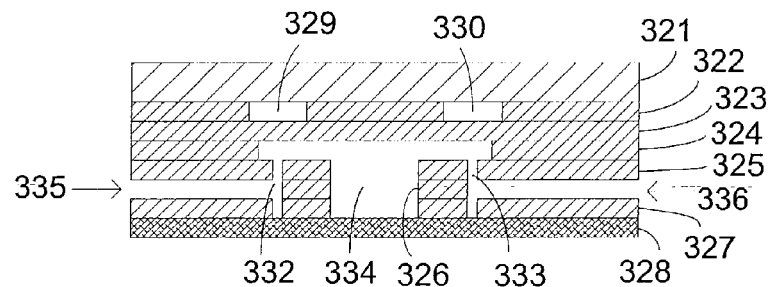
FIG. 9C is a cross-sectional view of a portion of the device of FIG. 9A along section lines "G"-"G".

Another embodiment for combining discrete fluid volumes utilizes a porous material, preferably a hydrophobic porous material, to vent a sample chamber. Referring to FIGS. 9A-9C, a microfluidic device for combining four pairs of two fluids each is constructed with eight layers 321-328. The device 320 permits four plugs of each fluid to be metered and then combined (in four separate sample chambers) in simultaneous fashion. FIG. 9A is a top view of the device 320, FIG. 9B is an expanded top view of a portion of the device 320 illustrating section lines "G"-"G", and FIG. 9C is a side sectional view of a portion of the device 320 along section lines "G"-"G". Preferably, the first layer 321 is a substrate; the second, fourth, and sixth layers 322, 324, 326 are double-sided self-adhesive tape; the third layer 323 is a deformable membrane such as a 4 mil thick latex film; the fifth layer 325 is a non-adhesive film; the seventh layer 327 is single-sided tape with the adhesive facing down; and the eighth layer 328 is a porous membrane. More preferably, the first layer 321 is a rigid solid to facilitate controlled pressurizing of actuation chambers 329, 330 in the second layer 322. The second layer 322 defines two actuation chambers 329, 330 for each sample chamber 334 positioned above fluidic apertures 332, 333 in the fifth layer 325, so that pressurization of the actuation chambers 329, 330 locally deforms the deformable third layer 323 to block the apertures 332, 333, thus operating as membrane valves. Four sample chambers 334 are defined in the fourth through seventh layers 324-327, with the lower boundary of each chamber 334 being the porous eighth layer 328. Upon delivery of two plugs to a sample chamber 334, any air present in the chamber 334 will be displaced through the porous layer 328 that prevent the plugs from escaping. The fluidic apertures 332, 333 are laterally offset from the walls of the sample chamber 334 in the fifth layer 325 to permit the apertures 332, 333 to be fully covered when the actuation chambers 329, 330 are pressurized.

In operation, one fluid plug is provided to each channel segment 335, 336 at opposite sides of each sample chamber 334. The plugs are communicated to the channel segments 335, 336 from inlet ports 337A, 337B, 338A, 338B in the first layer 321 and fluidic channels 339, 340. Along each side of the device, junctions 341 divide the fluidic streams into four segments 335, 336 wherein the plugs are formed. Fluid in the channels 339 may be flushed with a pressurized gas, to flow from the inlets 337A, 338A to the outlets 337B, 338B to define the discrete plugs in the eight branch channels 335, 336. The aggregate volume of each plug should be slightly less than half the volume of the each sample chamber 334 to permit two plugs to fit in a sample chamber 334 with a little room for air to escape on each side. Pressure is applied to the plugs from behind as they the plugs are conveyed to the sample chamber 334; preferably, the applied pressure is less than the pressure applied to the actuation chambers 329, 330 to prevent the membrane valves from leaking. In a preferred embodiment, the actuation chambers 329, 330 are pressurized to approximately about 2-4 psi to close the valves, and the pressure applied to each fluid plug is less than 1 psi. However, the degree of pressure to be applied depends on the porosity and material of the porous eighth layer 328. There is a 'water intrusion pressure' at which water will permeate the porous membrane 328. The pressure applied to the fluid plugs advantageously does not exceed the water intrusion pressure of the porous eighth layer 328. In a preferred embodiment, a pressure of 0.3 psi applied to the fluid plugs is sufficient to move the fluid and does not exceed the water intrusion pressure for most hydrophobic porous membranes.

Figure 10A:
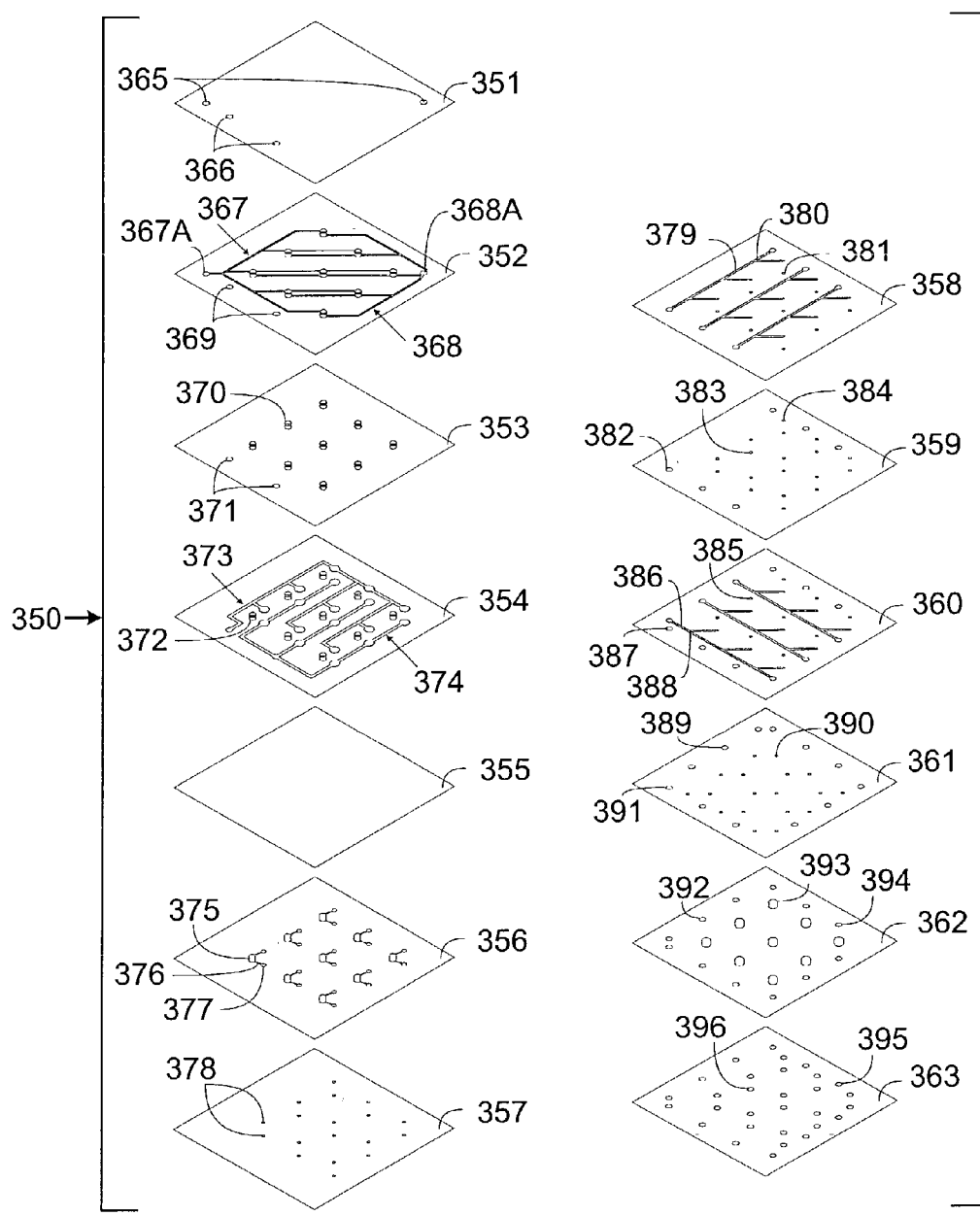
FIG. 10A is an exploded perspective view of a thirteen-layer microfluidic device capable of combining discrete amounts of three different samples and three different reagents to yield nine discrete combinations.
Figure 10B:
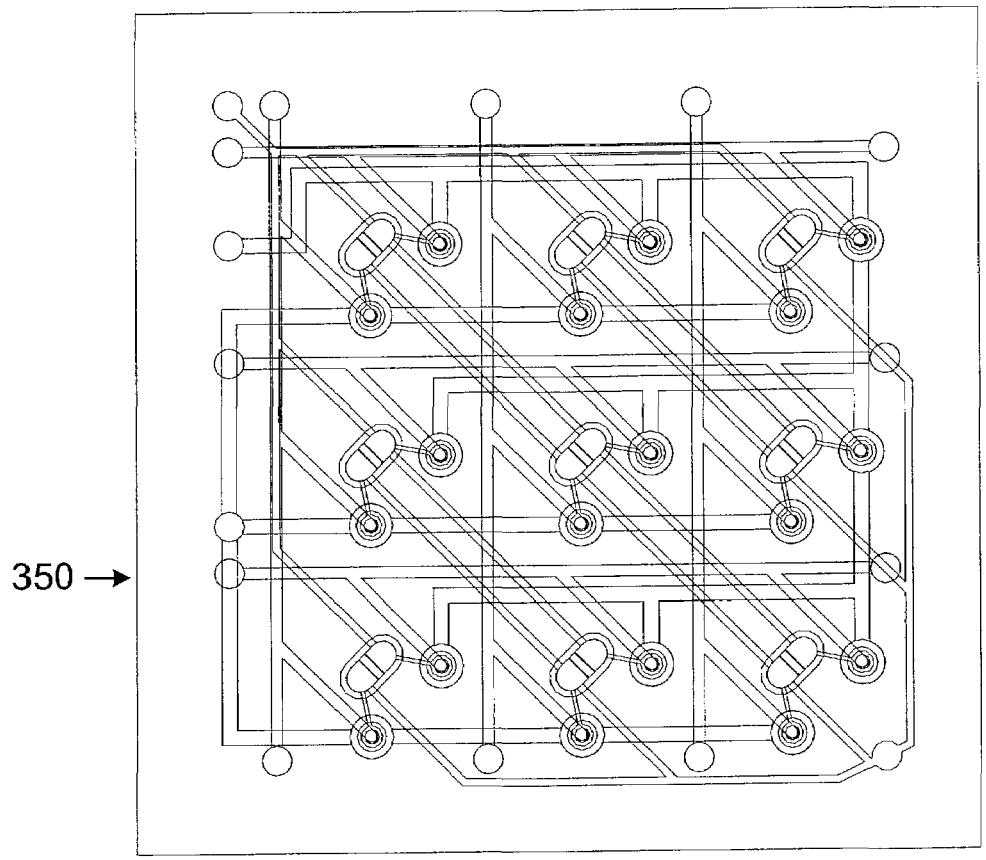
FIG. 10B is a top view of the assembled device of FIG. 10A.
Figure 10C:
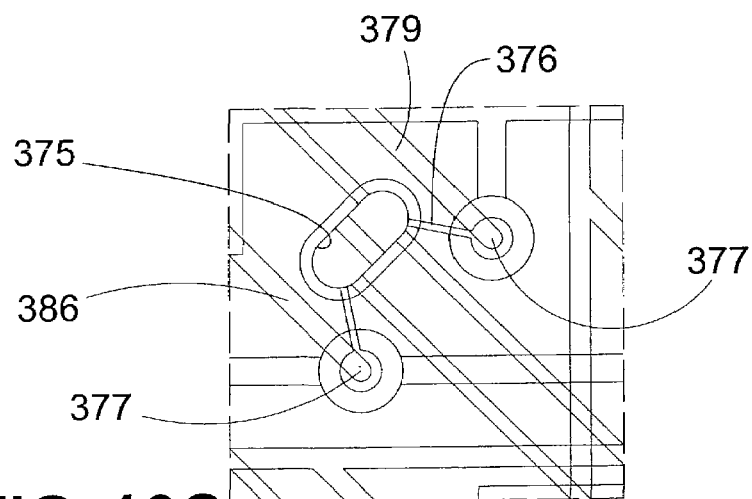
FIG. 10C is an expanded top view of a portion of the device of FIGS. 10A-10B.

FIGS. 10A-10C show an example of a combinatorial microfluidic device 600 according to one embodiment permitting three different samples and three different reagents, all of uncertain volumes, to be metered and combined in nine distinct sample chambers. Referring to FIG. 1A, the device 350 was constructed from thirteen layers, including a substrate and stacked stencils. The first layer 351 was a rigid 2-¼"×2-¼" square substrate having two pairs of ports 365, 366 for a control fluid such as "high pressure" (approximately 10 psi) air. The second layer 352, constructed from a 5.5 mil double-sided tape having a PET carrier and acrylic adhesive on both sides, was used to control valves within each sample chamber 375. As used in connection with FIGS. 10A-10C, the term "valve" refers to the combination of a pressurizable chamber, a response chamber, and a deformable membrane separating the chambers. Two separate networks 367, 368 of channels and chambers, each fed by vias 367A, 368A at opposite corners of the device 350, were defined in the second layer 352 to permit one side of each sample chamber 375 to be simultaneously controlled by the high pressure control fluid. The third layer 353 was made of 2 mil biaxially oriented polypropylene film and defined nine pairs of membrane valve vias 370, one port of each pair being in fluid communication with one network in the second layer 352. The second layer 352 and third layer 353 further included vias 369, 371 to permit transmission of fluid from the ports 366 in the first layer 351 to the fourth layer 354. The fourth layer 354 was formed of the same double sided tape as used in the second layer 352, and was used to control membrane valve regions 377 adjacent to the sample chambers 375. Similar to the second layer 352, two separate networks 373, 374 of channels and chambers, fed by the vias 371, were defined in the fourth layer 354 to permit one membrane valve region 377 corresponding to each sample chamber 375 to be simultaneously controlled. The fifth layer 355 was a deformable (flexible) membrane made of 4 mil latex film, used as the valving material in the mixing chambers 375 and membrane valve regions 377. The sixth layer 356 was constructed from the same double-sided tape used in the second and fourth layers 352, 354. Defined in the sixth layer 356 were nine sample chambers 375, each having two associated membrane valve cavities 377 and channels 376 to connect each membrane valve cavity to its associated sample chamber 375. The seventh layer 357 was made of the same polypropylene film material used in the third layer 353, and defined nine pairs of vias 378 connecting to the membrane valve cavities 377 in the sixth layer 356. The eighth layer 358 was made of double sided tape (the same as the second, fourth, and sixth layers 352, 354, 356) and defined three networks 379 of branched channels (each incorporating three splitters 380) to divide three streams of fluid (e.g., reagents) into three plugs per channel. The ninth layer 359 was made of the same polypropylene film as was used in the third and seventh layers 353, 357, and included vent vias 384 (to permit air to escape downward when loading plugs), central fluid vias 383 to provide fluidic connection to the sample chambers 375, and peripheral vias 382. The tenth layer 360 was made of double-sided tape (the same as used in the preceding even-numbered layers) and defined three networks 386 of branched channels, each incorporating three splitters 388 and functioning the same as the networks in the eighth layer 358 to divide three fluids (e.g., three samples) into a total of nine plugs. The tenth layer 360 further defined vias for communicating fluid to the ninth layer 359 and onward to the eighth layer 358. The eleventh layer 361 was made of single sided tape composed of a 1 mil polyester carrier with 0.8 mil of acrylic adhesive, adhesive side down. The eleventh layer 361 functioned to provide a smooth bottom surface for channels in the tenth layer 360, to provide vent vias 390, and peripheral fluid vias 389, 391, e.g., for samples and reagents. The twelfth layer 362 was made of a hydrophobic porous polyethylene film with pore sizes of 2.5-4.5 microns, and functioned to allow air to escape from plug channels, but keep fluid within the device 350. Since the porous film of the twelfth layer 362 was opaque, nine central windows 393 were cut in the film to facilitate observation or analysis of the sample chambers 375 from below. Further defined in the twelfth layer 362 were peripheral fluid vias 392, 394, e.g., for samples and reagents. Finally, the thirteenth layer 363 was made of single-sided tape (the same material as layer 11) and functioned to cover the porous material of the twelfth layer 362 except where central vents 396 and peripheral ports 395 were defined. The assembled device 350 is shown in FIG. 10B, with a portion of the device enlarged in FIG. 10C to show additional detail.

To prepare the microfluidic device 350 for operation, the device 350 was connected to a high-pressure air source and isolation valves (not shown) from above at the ports 365, 366, and to six fluid sources (delivering liquid and low-pressure air) from below at the ports 395. The high-pressure air sources were pressurized to approximately 10 psi to close the sample chamber 375 valves and the associated membrane valves 377. The sample chamber valves were of a "collapsed chamber" design, as discussed herein. In operation, with the valves 375, 377 closed, six liquid streams were injected into the device with syringes (not shown) using the ports 395 to completely fill the branched channel networks 379, 386 located in the eighth and tenth layers 358, 360. Thereafter, air (behind each liquid in the syringes) was forced into the ports 395 to purge excess liquids in the channels 379, 386 out of the device, leaving behind metered plugs of liquid filling only the channel branches. Thus, for each fluid stream, three plugs of a known volume were metered off from streams of indeterminate volume to form a total of eighteen plugs. Two plugs were formed adjacent to each sample chamber 375, with each sample chamber 375 having two sample chamber 375 valves (actuated by the networks 367, 368) and two associated membrane valves 377 (actuated by the network 373, 374). Following formation of all eighteen plugs, they were moved into the sample chambers in groups of nine. The following procedure applies simultaneously to each of the nine chambers, since the controls for each sample chamber were connected in parallel. First, two high pressure air sources were released, reducing localized downward deflection of the deformable membrane in selected locations to open one sample chamber valve and the corresponding membrane valve 377. With these valves open, one plug was forced into the chamber by pressurizing the fluid inlet to approximately 15 inches of water. Once the plug was in the chamber 375, the membrane valve was closed. This process was then repeated on the other half of the sample chamber 375: as the other sample chamber valve and corresponding membrane valve were opened, the plug was pushed into the chamber, and the membrane valve was closed. At that point, both plugs were present in the sample chamber and they were free to diffuse together. Thus, a total of nine microfluidic mixtures are formed quickly in a compact 2-¼×2-¼ device 350. The device 350 is useful for performing, for example, multiplexed homogeneous assays or combinatorial synthesis.

In the embodiment shown in FIGS. 10A-10C., membrane valves were provided separate from associated sample chamber valves to facilitate observation or analysis of the contents of the sample chambers. Since neither the latex membrane comprising the fifth layer 355 nor the porous vent material of the twelfth layer 362 were optically clear, separating the membrane valves from the sample chambers and providing windows through the twelfth layer 362 permitted an optically clear path to the sample chambers to be maintained from below. Preferably, substantially optically transmissive materials are used for device layers or portions of device layers too permit visual inspection and/or interface with standard optical detection devices such as UV-VIS detectors. Additionally, in certain applications it may be desirable to prevent evaporation of the resulting mixtures. Isolating the membrane valves (which permit evaporation) from the sample chamber permits the channels connecting the membrane valves and sample chambers to be sealed (such as by localized heat-sealing) to encapsulate the contents in the sample chambers, thereby preventing their evaporation.

Figure 11A:
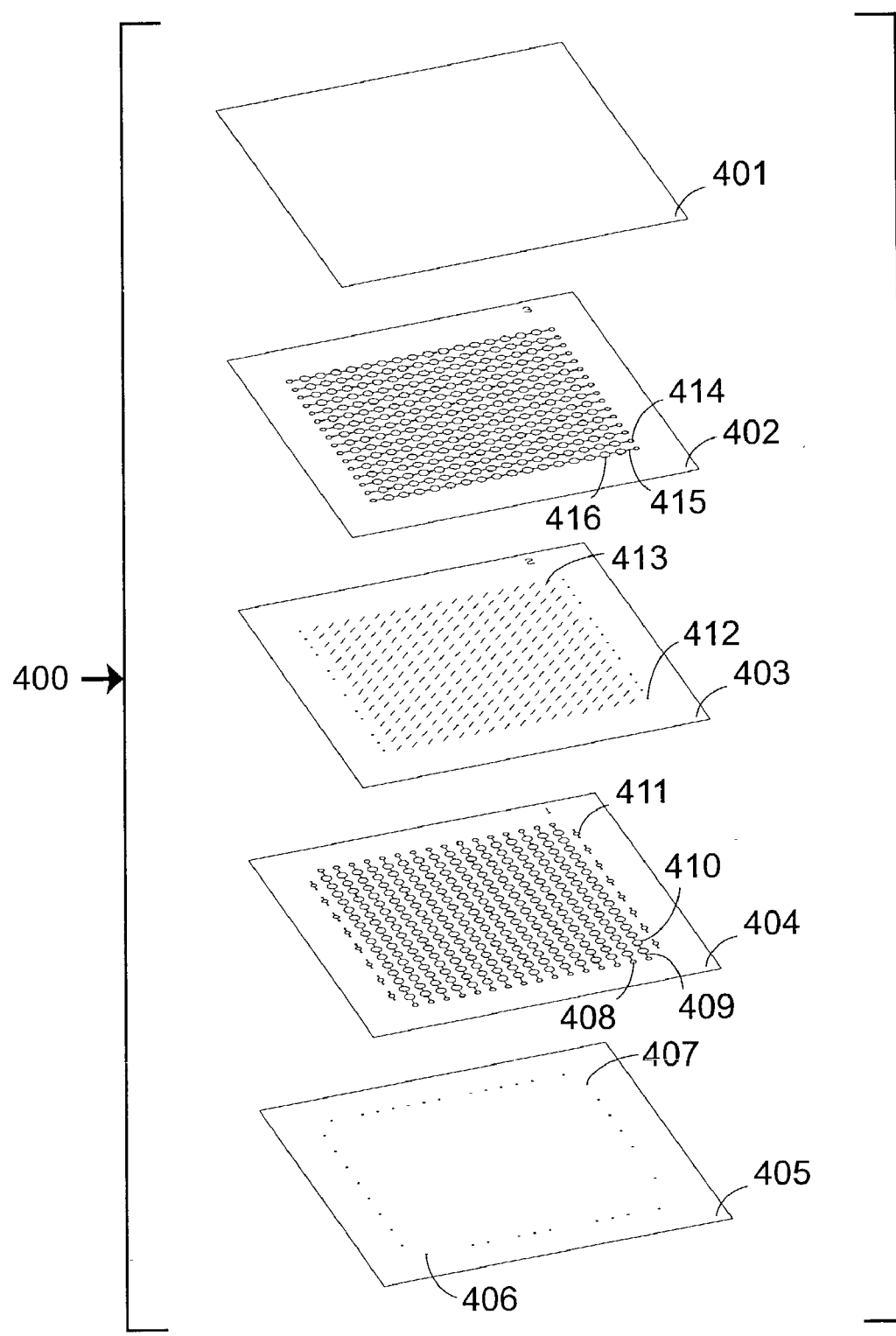
FIG. 11A is an exploded perspective view of a five-layer microfluidic device having eight fluid inputs along one axis and sixteen fluid inputs along another axis, the device permitting discrete amounts of fluids to be combined in many combinations.
Figure 11B:
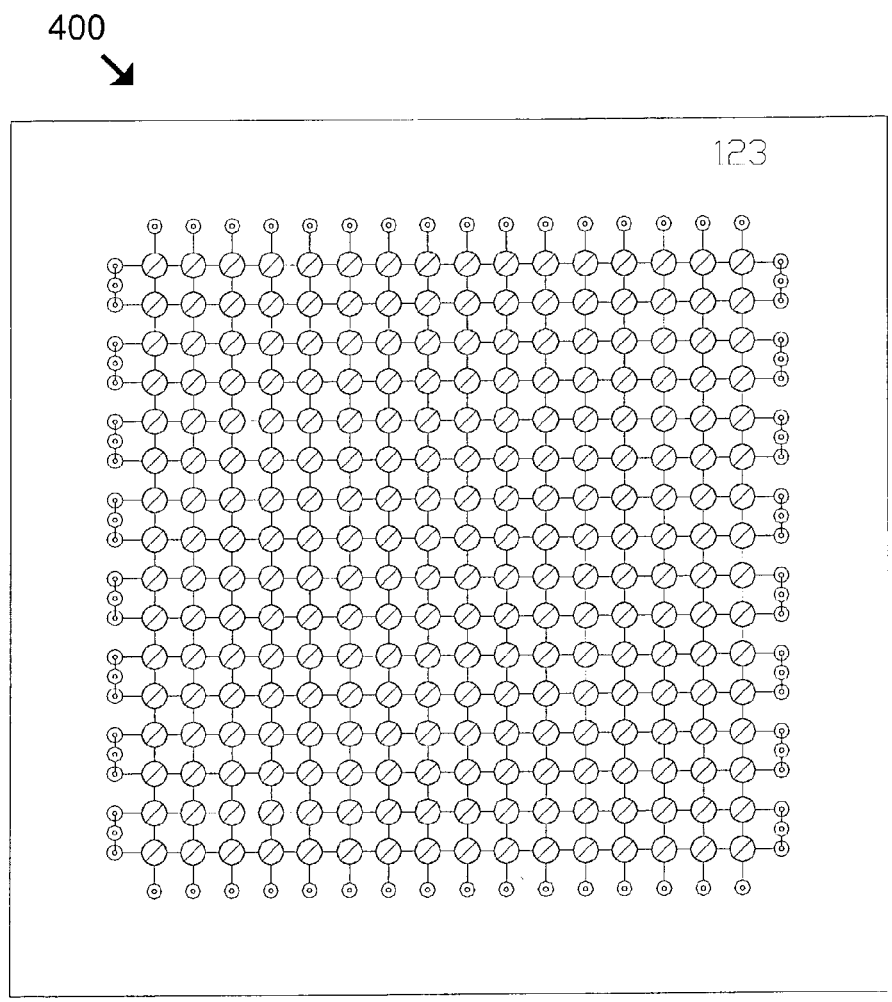
FIG. 11B is a top view of the assembled device of FIG. 11A.

In further embodiments, microfluidic devices having high component densities may be constructed. For example, combinatorial mixers according to the present invention may be constructed in various formats and densities, including but not limited to formats such as: 8, 16, 24, or 64 sample (mixing) chambers within a square device having a side length of 2-¼ inches (having mixer densities ranging from 1.6 to 12.6 chambers/in$^2$, or 0.24 to 1.93 chambers/cm$^2$); 256 sample chambers within a square device having a side length of 2-⅞ inches (having a mixer density of 31 chambers/in$^2$, or 4.7 chambers/cm$^2$); 96, 384, or 1536 sample chambers within an area of 8 cm×12 cm (having mixer densities ranging from 1 to 16 chambers/cm$^2$, or 6.5 to 105 chambers/in$^2$). Referring to FIGS. 11A-11B, an array of 256 mixing chambers was constructed in a single 5-layer square device 400 measuring 2-⅞ inches on each side. FIG. 11A provides an exploded view of the five layers, and FIG. 11B is a top view of the assembled device 400. Although a similar device could be constructed to receive sixteen fluidic inlets along each axis, the particular device depicted in FIGS. 11A-11B is configured to accept sixteen separate fluidic inlets 406 along one axis and eight separate fluidic inlets 407 along the other. This configuration results in two mixing chambers for each fluidic combination to provide intentional redundancy on the device. Such redundancy may be desirable to confirm synthesis results and/or reduce systematic error. The first layer 401 serves as a cover; the second layer 402 defines sixteen peripheral apertures 414 each along two sides of the layer, and sixteen linear channels 415 each having sixteen chambers 416; the third layer 403 defines sixteen peripheral vias 412 each along two sides of the layer 403, and 256 slits 413 to permit fluidic exchange between chambers 416 and 410 on the second and fourth layers 402, 404; the fourth layer 404 has sixteen channels 409 each having sixteen chambers 410, with eight peripheral apertures 411 each along two sides of the layer 404 for dividing each corresponding inlet stream in half; and the fifth layer 405 defines sixteen fluidic inlet ports 406 along two sides and eight fluidic inlet ports 407 along the remaining sides. In operation, fluids are introduced to the 256 chambers on the second and fourth layers 402, 404 and are prevented from mixing by the intermediate third layer 403. A pressure differential can then be applied to force fluid through the slits 413 in the third layer 403 to induce diffusion between the plugs. Two iterations each of 128 different fluid combinations or mixtures are formed. Alternatively, the device 400 may be deformed to cause the fluids to mix. Other methods of rupturing the slits may be used.

In further embodiment, deformable membranes may be magnetically actuated. Any of the preceding embodiments utilizing deformable membranes could be modified to be operated magnetically rather than pneumatically. For example, and without limitation, FIGS. 13A-13B provide an alternative actuation mechanism for deformable membranes compared to the pneumatic actuation disclosed in FIGS. 9A-9C.

Generally, magnetic actuation requires a field generator and a magnetic (i.e., paramagnetic or ferromagnetic) element. The magnetic element moves in response to application of a magnetic field, with the direction of motion of the magnetic element depending on the direction of the applied magnetic field. Opening or closing force of a magnetically actuated valve may be adjusted by varying the magnitude of the applied magnetic field, or selecting a magnetic element with appropriate response characteristics (e.g., magnetization). For example, if strong magnetization is desirable, then magnetic elements formed from rare earth magnetic materials may be used.

Figure 12:
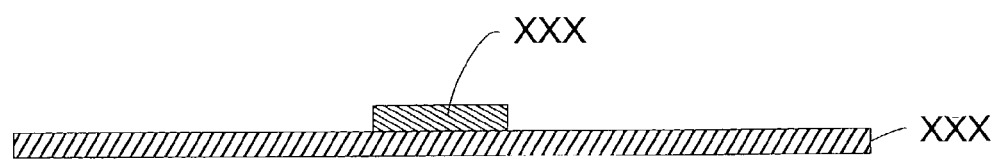
FIG. 12 is a side view of a deformable membrane having a ferromagnetic or paramagnetic material region.

Preferably, at least one magnetic element is integrated with a deformable membrane. In a preferred embodiment, a deformable membrane includes one or more discrete magnetic elements. A discrete magnetic element may be attached to a deformable membrane using various means including adhesives and mechanical retention. For example, FIG. 12 illustrates a magnetic element 421 affixed to a deformable membrane 420 using an adhesive. In a more preferred embodiment shown in FIGS. 13A-13B, a discrete magnetic element 458 is sandwiched within multiple deformable membrane layers 451A. 451B, 451C to form a composite membrane 451. Contact between the layers 451A-451C and the magnetic element 458 may be maintained with an adhesive, such as if one or more of the layers 451A-451C were formed of a self-adhesive tape material. Further preferably, the central membrane layer 451B may be a stencil layer defining an aperture into which the magnetic element 458 is inserted. Multiple membrane layers 451A-451C may be laminated together using conventional bonding methods such as, for example, adhesive or thermal bonding. Adhesiveless films of deformable materials such as latex, polypropylene, polyethylene, and polytetrafluoroethylene are readily available in thicknesses of approximately 0.5 mil (13 microns) or less. If supplied as self-adhesive tape, such materials are readily available with a total (carrier plus adhesive) thickness between approximately 1.5 and 2.0 mils (38 to 50 microns). An embodiment such as shown in FIGS. 13A-13B may thus be provided with a combined membrane thickness of approximately 2.0 to 2.5 mils (50 to 63 microns). In an embodiment such as shown in FIGS. 13A-13B, the central membrane layer 451B may be a stencil layer formed of contact adhesive, so as to form a laminated membrane 451 of approximately the same total thickness as before (approximately 2.0 to 2.5 mils, or 50 to 63 microns).

A discrete magnetic element to be integrated with a membrane layer may be provided in any size or shape sufficient to promote the desired flow control characteristics. If the flow control device utilizes a valve seat of a particular geometry, then the desired shape and size of the magnetic element is preferably selected to interface with the valve seat geometry. Particular shapes of magnetic elements that may be used include cylindrical, spherical, or annular shapes. A valve seat may include an aperture that may be selectively sealed to control fluid flow. Preferably, the membrane may be deformed by magnetic force to seal the aperture, thus preventing fluid flow. Alternatively, an annular magnetic element may be disposed adjacent to an aperture defined in a membrane, so that under certain conditions fluid is permitted to flow through both the membrane aperture and the annular magnetic element. This fluid flow path may be selectively blocked or re-established through application of a magnetic field that deforms the membrane against a valve seating surface.

As an alternative to using one or more discrete magnetic elements, a deformable membrane comprising a diffuse magnetic layer may be provided. If a diffuse magnetic layer is used, then it is preferably coupled to a deformable membrane selected for desirable material properties such as chemical compatibility or sealing characteristics.

A magnetic field generator for use with a magnetically deformable membrane preferably comprises a coil of current-carrying wire, preferably insulated wire. Current may selectively applied to the coil, such as by using an external current source, to generate a magnetic field. The strength of the magnetic field may be adjusted by varying the magnitude of the current and the number of turns of wire. The direction of the resulting magnetic field is parallel to the central axis of the coil. In a more preferred embodiment, a field-concentrating element, such as a ferromagnetic core, is provided along the central axis of the coil. A magnetic field generator 470 having a field-concentrating element 471 and a coil of insulated wire 472 is shown in FIGS. 13A-13B. The field-concentrating element 471 is preferably substantially cylindrical in shape, and if a highly focused field is desired then the cylinder should be of a small diameter. The current-carrying wire 472 may be directly wrapped around the field-concentrating element 471.

As further shown in FIGS. 13A-13B, a magnetically actuated membrane valve is operated by selectively applying current to the coil 474. To deform the membrane 451 (formed from laminated layers 451A-451C and magnetic element 458) in one direction, current in one direction is applied to the coil 472. To reverse the travel of the membrane 451, current is applied in the opposite direction. FIG. 13A shows the membrane 451 in a relaxed position, with the field generator 470 substantially centered above the magnetic element 458, which in turn is substantially centered over an aperture 457 permitting fluid communication between a first channel segment 456 and a sample chamber 459 within a microfluidic device 450. The device 450 is formed with a three-layer composite membrane 451 and four other device layers 452-455. FIG. 13B shows the membrane 451 in a deformed position and contacting the seating layer 452 defining the aperture 457 to prevent fluid flow between the first channel segment 456 and the sample chamber 459.

In a preferred embodiment, multiple magnetically actuated flow control valves may be integrated into a single microfluidic device. A microfluidic device may includes at least one deformable membrane and multiple discrete magnetic elements. Preferably, such a device may be used to manipulate fluid between multiple fluidic inlet ports and multiple sample chambers. A magnetic field generator array having multiple coils and field concentrating elements may be positioned in relatively close proximity to the microfluidic flow control device to manipulate fluid within the device. However, the field generator array preferably does not contact the microfluidic device. Preferably, one coil and field focusing element is provided and paired with each magnetic element. One advantage of using field focusing elements in such a device is to minimize unwanted interference between unpaired coils and magnetic elements. High density arrays of field generators may thus be used to provide precise control over fluid flowing in a small area. Complex operation of a fluidic system can thus be provided without requiring any external component to ever physically contact the device.

Microfluidic devices according to the present invention may be used to perform combinatorial syntheses of peptides, proteins, and DNA and RNA oligomers as currently performed in macrofluidic volumes. For example, the following may be performed: combinatorial synthesis and/or screening of plasmids, aptimers, proteins, and peptides; evaluating enzyme activity; and derivatizing proteins and carbohydrates. A broad spectrum of biochemical and electrophysiological assays may also be performed, including: (1) genomic analysis (sequencing, hybridization), PCR and/or other detection and amplification schemes for DNA, and RNA oligomers; (2) gene expression; (3) enzymatic activity assays; (4) receptor binding assays; and (5) ELISA assays. The foregoing assays may be performed in a variety of formats, such as: homogeneous, bead-based, and surface bound formats including microtiter-based assays using any of a number of detection schemes known to those skilled in the art.

It is to be understood that the illustrations and descriptions of views of individual microfluidic tools, devices and methods provided herein are intended to disclose components that may be combined in a working device. Various arrangements and combinations of individual tools, devices, and methods provided herein are contemplated, depending on the requirements of the particular application. The particular microfluidic tools, devices, and methods illustrated and described herein are provided by way of example only, and are not intended to limit the scope of the invention.

What is claimed is:

1. A multi-layer microfluidic device for combining discrete volumes of at least two fluids, the device comprising:
   a microfluidic chamber;
   a first microfluidic channel adapted to supply a first fluid to the microfluidic chamber;
   a second microfluidic channel adapted to supply a second fluid to the microfluidic chamber;
   a deformable membrane bounding a surface of the microfluidic chamber, the deformable membrane including a first membrane portion adapted to selectively block the passage of the first fluid from the first microfluidic channel into the microfluidic chamber, and including a second membrane portion adapted to selectively block the passage of the second fluid from the second microfluidic channel into the microfluidic chamber;
   wherein the first membrane portion and the second membrane portion are independently actuatable, and the deformable membrane is adapted to permit the first fluid to contact the second fluid within the microfluidic chamber.

2. The microfluidic device of claim 1 wherein the first microfluidic channel is a first microfluidic branch channel and the second microfluidic channel is a second microfluidic branch channel, the device further comprising:
   a first microfluidic trunk channel in fluid communication with the first microfluidic branch channel, the first microfluidic trunk channel having a first fluid inlet and a first fluid outlet; and
   a second microfluidic trunk channel in fluid communication with the second microfluidic branch channel, the second microfluidic trunk channel having a second fluid inlet and a second fluid outlet.

3. The microfluidic device of claim 1 wherein the deformable membrane is adapted to divide the microfluidic chamber into a plurality of discrete subchambers.

4. The microfluidic device of claim 1, further comprising a plurality of actuation chambers in fluid communication with the deformable membrane, each actuation chamber being adapted to permit manipulation of a different portion of the deformable membrane.

5. The microfluidic device of claim 1 wherein the deformable membrane includes a ferromagnetic or paramagnetic material.

6. The microfluidic device of claim 1 wherein the microfluidic chamber is bounded along at least one surface by a substantially optically transmissive material.

7. The microfluidic device of claim 1, further comprising a plurality of microfluidic chambers arranged in a two-dimensional array.

8. The microfluidic device of claim 1 wherein at least one layer of the multi-layer device is a stencil layer.

9. The microfluidic device of claim 1 wherein at least one layer of the multi-layer device comprises a self-adhesive tape.

10. The microfluidic device of claim 1 wherein at least one layer of the multi-layer device comprises a polymeric material.

11. The microfluidic device of claim 1, further comprising a porous region in fluid communication with the microfluidic chamber.

12. The microfluidic device of claim 11 wherein the porous region is vented to atmosphere.

13. The microfluidic device of claim 11 wherein the porous region is in selective fluid communication with a vacuum source.

14. The microfluidic device of claim 1 wherein the microfluidic chamber has a volume of less than about 1 microliter.

15. The microfluidic device of claim 1, wherein the first microfluidic channel has a first width, the secoad microfluidic channel inlet has a second width, and the microfluidic chamber has a width that is greater than each of the first width and the second width.

* * * * *